(12) United States Patent
Taketani et al.

(10) Patent No.: US 9,171,906 B2
(45) Date of Patent: Oct. 27, 2015

(54) SEMICONDUCTOR DEVICE HAVING A TRENCH GATE STRUCTURE AND MANUFACTURING METHOD OF THE SAME

(71) Applicant: DENSO CORPORATION, Kariya, Aichi-pref. (JP)

(72) Inventors: Eiichi Taketani, Nukata-gun (JP); Seigo Oosawa, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/278,430

(22) Filed: May 15, 2014

(65) Prior Publication Data

US 2014/0246718 A1 Sep. 4, 2014

Related U.S. Application Data

(62) Division of application No. 13/443,059, filed on Apr. 10, 2012.

(30) Foreign Application Priority Data

| Apr. 12, 2011 | (JP) | 2011-88573 |
| Apr. 28, 2011 | (JP) | 2011-101811 |
| Feb. 24, 2012 | (JP) | 2012-39017 |

(51) Int. Cl.
*H01L 21/336* (2006.01)
*H01L 29/78* (2006.01)
(Continued)

(52) U.S. Cl.
CPC ...... *H01L 29/1095* (2013.01); *H01L 21/28211* (2013.01); *H01L 29/0878* (2013.01);
(Continued)

(58) Field of Classification Search
CPC ............ H01L 29/7813; H01L 29/66734; H01L 29/7397; H01L 29/42368; H01L 29/66727; H01L 29/1095
See application file for complete search history.

(56) References Cited

U.S. PATENT DOCUMENTS 5,473,176 A 12/1995 Kakumoto
5,818,084 A * 10/1998 Williams et al. ............. 257/329
(Continued)

FOREIGN PATENT DOCUMENTS

JP 03-211885 A 9/1991
JP 08-288382 A 11/1996
(Continued)

OTHER PUBLICATIONS

"Oxide growth on silicon (100) in the plasma phase of dry oxygen using an electron cyclotron resonance source," Keunjoo Kim, M. H. An, Y. G. Shin, M. S. Suh, C. J. Youn, Y. H. Lee, K. B. Lee, and H. J. Lee, Korea, J. Vac. Sci. Technol. B 14(4), Jul./Aug. 1996.*
(Continued)

*Primary Examiner* — Laura Menz
*Assistant Examiner* — Maliheh Malek
(74) *Attorney, Agent, or Firm* — Posz Law Group, PLC

(57) ABSTRACT

In a manufacturing method of a semiconductor device, a trench is defined in a semiconductor substrate, and an adjuster layer having a first conductivity type impurity concentration higher than a drift layer is formed at a portion of the semiconductor substrate adjacent to a bottom wall of the trench. A channel layer is formed by introducing second conductivity type impurities to a portion of the semiconductor substrate adjacent to a sidewall of the trench and between the adjustment layer and a main surface of the semiconductor substrate while restricting the channel layer from extending in a depth direction of the trench by the adjustment layer.

6 Claims, 24 Drawing Sheets

(51) Int. Cl.
  *H01L 29/10* (2006.01)
  *H01L 21/28* (2006.01)
  *H01L 29/08* (2006.01)
  *H01L 29/66* (2006.01)
  *H01L 21/265* (2006.01)
  *H01L 29/06* (2006.01)
  *H01L 29/417* (2006.01)
  *H01L 29/423* (2006.01)
  *H01L 29/739* (2006.01)

(52) U.S. Cl.
  CPC .... *H01L29/66727* (2013.01); *H01L 29/66734* (2013.01); *H01L 29/7808* (2013.01); *H01L 29/7813* (2013.01); *H01L 21/26586* (2013.01); *H01L 29/0626* (2013.01); *H01L 29/41766* (2013.01); *H01L 29/42368* (2013.01); *H01L 29/7397* (2013.01)

(56) References Cited

U.S. PATENT DOCUMENTS

| | | | | |
|---|---|---|---|---|
| 6,031,265 A * | 2/2000 | Hshieh | | 257/334 |
| 6,103,578 A * | 8/2000 | Uenishi et al. | | 438/268 |
| 6,144,054 A * | 11/2000 | Agahi et al. | | 257/296 |
| 6,262,470 B1 * | 7/2001 | Lee et al. | | 257/565 |
| 6,342,709 B1 * | 1/2002 | Sugawara et al. | | 257/139 |
| 6,351,018 B1 * | 2/2002 | Sapp | | 257/499 |
| 6,469,345 B2 | 10/2002 | Aoki et al. | | |
| 6,569,738 B2 * | 5/2003 | Darwish | | 438/270 |
| 6,624,469 B1 * | 9/2003 | Harada | | 257/330 |
| 6,657,254 B2 * | 12/2003 | Hshieh et al. | | 257/330 |
| 6,864,532 B2 * | 3/2005 | Aoki et al. | | 257/330 |
| 6,903,412 B2 * | 6/2005 | Darwish et al. | | 257/330 |
| 6,927,451 B1 | 8/2005 | Darwish | | |
| 7,241,694 B2 * | 7/2007 | Takeuchi et al. | | 438/700 |
| 7,268,032 B2 * | 9/2007 | Darwish et al. | | 438/212 |
| 7,326,975 B2 * | 2/2008 | Kim et al. | | 257/269 |
| 7,354,829 B2 | 4/2008 | Aoki et al. | | |
| 7,435,650 B2 * | 10/2008 | Darwish et al. | | 438/270 |
| 7,439,580 B2 * | 10/2008 | Kinzer et al. | | 257/330 |
| 7,470,953 B2 * | 12/2008 | Takaya et al. | | 257/330 |
| 7,615,812 B1 * | 11/2009 | Metzler et al. | | 257/288 |
| 8,378,392 B2 * | 2/2013 | Hsieh | | 257/270 |
| 8,581,336 B2 * | 11/2013 | Long et al. | | 257/331 |
| 8,803,207 B2 * | 8/2014 | Grebs et al. | | 257/288 |
| 8,884,365 B2 * | 11/2014 | Yilmaz et al. | | 257/332 |
| 8,927,367 B2 * | 1/2015 | Jeong et al. | | 438/270 |
| 2003/0062569 A1 * | 4/2003 | Letavic | | 257/330 |
| 2003/0102564 A1 * | 6/2003 | Darwish | | 257/769 |
| 2003/0207538 A1 * | 11/2003 | Hshieh et al. | | 438/270 |
| 2003/0235959 A1 * | 12/2003 | Lichtenberger et al. | | 438/272 |
| 2004/0159885 A1 * | 8/2004 | Kawano et al. | | 257/330 |
| 2004/0188756 A1 * | 9/2004 | Matsuda | | 257/330 |
| 2004/0229420 A1 * | 11/2004 | Shibata | | 438/202 |
| 2004/0251491 A1 * | 12/2004 | Ma et al. | | 257/329 |
| 2005/0001264 A1 * | 1/2005 | Ono et al. | | 257/330 |
| 2005/0029586 A1 * | 2/2005 | Ono et al. | | 257/330 |
| 2006/0086972 A1 * | 4/2006 | Shibata et al. | | 257/330 |
| 2006/0244053 A1 * | 11/2006 | Tsuzuki et al. | | 257/328 |
| 2006/0244104 A1 * | 11/2006 | Ozeki et al. | | 257/587 |
| 2006/0267088 A1 * | 11/2006 | Sharp et al. | | 257/341 |
| 2006/0273351 A1 * | 12/2006 | Ozoe et al. | | 257/220 |
| 2006/0281249 A1 * | 12/2006 | Yilmaz et al. | | 438/243 |
| 2008/0029812 A1 * | 2/2008 | Bhalla | | 257/330 |
| 2008/0035987 A1 * | 2/2008 | Hebert | | 257/330 |
| 2008/0087949 A1 * | 4/2008 | Maruoka et al. | | 257/330 |
| 2008/0164516 A1 * | 7/2008 | Darwish | | 257/329 |
| 2008/0182376 A1 * | 7/2008 | Pattanayak et al. | | 438/270 |
| 2008/0197361 A1 * | 8/2008 | Ueno | | 257/77 |
| 2008/0197407 A1 * | 8/2008 | Challa et al. | | 257/330 |
| 2008/0199997 A1 * | 8/2008 | Grebs et al. | | 438/270 |
| 2008/0230787 A1 * | 9/2008 | Suzuki et al. | | 257/77 |
| 2008/0311715 A1 * | 12/2008 | Hu et al. | | 438/278 |
| 2009/0032821 A1 * | 2/2009 | Onose et al. | | 257/77 |
| 2009/0114969 A1 * | 5/2009 | Suzuki et al. | | 257/301 |
| 2009/0146209 A1 * | 6/2009 | Akiyama et al. | | 257/334 |
| 2009/0189218 A1 * | 7/2009 | Pan | | 257/330 |
| 2009/0200559 A1 * | 8/2009 | Suzuki et al. | | 257/77 |
| 2009/0230465 A1 * | 9/2009 | Yilmaz et al. | | 257/330 |
| 2009/0261350 A1 * | 10/2009 | Yamamoto et al. | | 257/77 |
| 2009/0289264 A1 * | 11/2009 | Matsuki et al. | | 257/77 |
| 2009/0309156 A1 * | 12/2009 | Darwish et al. | | 257/332 |
| 2009/0315083 A1 * | 12/2009 | Pan et al. | | 257/280 |
| 2009/0315103 A1 * | 12/2009 | Hsieh | | 257/330 |
| 2010/0006861 A1 * | 1/2010 | Yamamoto et al. | | 257/77 |
| 2010/0006929 A1 * | 1/2010 | Andou | | 257/330 |
| 2010/0032751 A1 * | 2/2010 | Hebert | | 257/330 |
| 2010/0090274 A1 * | 4/2010 | Hsieh | | 257/331 |
| 2010/0112765 A1 * | 5/2010 | Yamaguchi et al. | | 438/212 |
| 2010/0140693 A1 * | 6/2010 | Hebert | | 257/333 |
| 2010/0163975 A1 * | 7/2010 | Hshieh | | 257/330 |
| 2010/0193799 A1 * | 8/2010 | Nakano et al. | | 257/77 |
| 2010/0258862 A1 * | 10/2010 | Yilmaz et al. | | 257/330 |
| 2010/0264488 A1 * | 10/2010 | Hsieh | | 257/334 |
| 2011/0068390 A1 * | 3/2011 | Ogasawara | | 257/330 |
| 2011/0070708 A1 * | 3/2011 | Hsieh | | 438/270 |
| 2011/0073938 A1 * | 3/2011 | Takahashi | | 257/328 |
| 2011/0079843 A1 * | 4/2011 | Darwish et al. | | 257/331 |
| 2011/0165748 A1 * | 7/2011 | Hsieh | | 438/286 |
| 2011/0169103 A1 * | 7/2011 | Darwish et al. | | 257/409 |
| 2011/0248340 A1 | 10/2011 | Hsieh | | |
| 2011/0254088 A1 * | 10/2011 | Darwish et al. | | 257/340 |
| 2011/0278642 A1 * | 11/2011 | Tu | | 257/130 |
| 2011/0298042 A1 * | 12/2011 | Tu | | 257/330 |
| 2011/0318895 A1 * | 12/2011 | Tu et al. | | 438/270 |
| 2012/0007173 A1 * | 1/2012 | Yamamoto et al. | | 257/330 |
| 2012/0043602 A1 * | 2/2012 | Zeng et al. | | 257/330 |
| 2012/0080748 A1 * | 4/2012 | Hsieh | | 257/331 |
| 2012/0098055 A1 * | 4/2012 | Darwish et al. | | 257/330 |
| 2012/0187478 A1 | 7/2012 | Takaya | | |
| 2012/0199900 A1 * | 8/2012 | Oosawa et al. | | 257/330 |
| 2012/0261746 A1 * | 10/2012 | Darwish et al. | | 257/330 |
| 2012/0319136 A1 * | 12/2012 | Noborio et al. | | 257/77 |
| 2013/0020635 A1 * | 1/2013 | Yilmaz et al. | | 257/334 |
| 2014/0004671 A1 * | 1/2014 | Hebert | | 438/270 |
| 2014/0264573 A1 * | 9/2014 | Kocon et al. | | 257/331 |

FOREIGN PATENT DOCUMENTS

| | | |
|---|---|---|
| JP | 3754266 B2 | 3/2006 |
| JP | 2008-4686 A | 1/2008 |

OTHER PUBLICATIONS

Office Action issued from the Japanese Patent Office dated Oct. 15, 2013 in the corresponding Japanese application No. 2012-039017 (with English translation).
Office Action mailed Oct. 28, 2014 issued in corresponding JP patent application No. 2013-255094 (and English translation).
Office Action dated May 22, 2014 issued in corresponding U.S. Appl. No. 13/443,059.
Office Action mailed Jul. 15, 2014 issued in corresponding JP Patent Application No. 2012-039017 (with English Translation).
Office Action mailed Nov. 24, 2014 issued in co-pending U.S. Appl. No. 13/443,059.
Notice of Allowance dated Mar. 12, 2015 mailed in the U.S. Appl. No. 13/443,059 (US 2012/0261714 A1).
Office Action mailed May 26, 2015 in the corresponding JP application No. 2013-255094 which is a divisional application of the basic JP application No. 2012-039017 (with English translation).

* cited by examiner

SEMICONDUCTOR DEVICE HAVING A TRENCH GATE STRUCTURE AND MANUFACTURING METHOD OF THE SAME

CROSS REFERENCE TO RELATED APPLICATIONS

The present application is a divisional application of U.S. utility application Ser. No. 13/443,059 filed on Apr. 10, 2012, which is based on and claims priority to Japanese Patent Applications No. 2011-88573 filed on Apr. 12, 2011, No. 2011-101811 filed on Apr. 28, 2011, and No. 2012-039017 filed on Feb. 24, 2012, the contents of which are incorporated in their entirety herein by reference.

TECHNICAL FIELD

The present disclosure relates to a manufacturing method of a semiconductor device having a trench gate structure. The present disclosure also relates to a semiconductor device having a trench gate structure.

BACKGROUND

Japanese Patent No. 3,754,266 discloses a semiconductor device having a trench gate structure and a manufacturing method of the semiconductor device. In the manufacturing method, after a trench is defined, a chemical-vapor deposition (CVD) oxide layer is deposited on the whole surface of a semiconductor substrate to fully fill the trench with the CVD oxide layer. Then, an etching process is performed so that the CVD oxide layer remains only at a bottom portion of the trench, that is, a buried oxide layer (hereafter, referred to as a bottom wall insulating layer) remains at a bottom portion of the trench. Subsequently, ions are implanted to the semiconductor substrate using the bottom wall insulating layer as a mask to form a channel layer along a sidewall of the trench.

SUMMARY

It is an object of the present disclosure to provide a manufacturing method of a semiconductor device having a trench gate structure, which can reduce variation in gate projection length. Another object of the present invention is to provide a semiconductor device having a trench gate structure.

In a manufacturing method of a semiconductor device according to an aspect of the present disclosure, a semiconductor substrate having a main surface and including a drift layer of a first conductivity type is prepared, and a trench is defined in the semiconductor substrate from the main surface into the drift layer. An adjustment layer is formed at a portion of the semiconductor substrate adjacent to a bottom wall of the trench. The adjustment layer has a first conductivity type impurity concentration higher than the drift layer. A gate insulating layer covering a sidewall and the bottom wall of the trench is formed. A channel layer is formed by introducing second conductivity type impurities to a portion of the semiconductor substrate adjacent to the sidewall of the trench and between the adjustment layer and the main surface while restricting the channel layer from extending in a depth direction of the trench by the adjustment layer. A gate electrode is embedded in the trench after the gate insulating layer is formed.

In a manufacturing method of a semiconductor device according to another aspect of the present disclosure, a semiconductor substrate having a main surface and including a drift layer of a first conductivity type is prepared, and a trench is defined in the semiconductor substrate from the main surface into the drift layer. A channel layer shallower than the trench is formed by implanting second conductivity type impurities from the main surface of the semiconductor substrate before or after the trench is defined. An adjustment layer is formed at a portion of the semiconductor substrate located on a bottom wall of the trench and adjacent to the channel layer by introducing first conductivity type impurities at a higher concentration than the drift layer. A gate insulating layer covering a sidewall and the bottom wall of the trench is formed. A gate electrode is formed in the trench after the gate insulating layer is formed. The adjustment layer restricts the channel layer from extending in a depth direction of the trench.

A semiconductor device according to another aspect of the present disclosure includes a semiconductor substrate, a drift layer, an adjustment layer, a channel layer, and one of a source layer and an emitter layer. The semiconductor substrate has a main surface and defines a trench from the main surface. The drift layer has a first conductivity type and is disposed at a portion in the semiconductor substrate adjacent to the trench. The adjustment layer is disposed on the bottom wall of the trench and has a first conductivity type impurity concentration higher than the drift layer. The channel layer has a second conductivity type and is disposed at a portion of the semiconductor substrate adjacent to a sidewall of the trench and between the adjustment layer and the main surface. The source layer or the emitter layer is disposed on a portion of the sidewall of the trench adjacent to the main surface. The source layer or the emitter layer has a first conductivity type impurity concentration higher than the drift layer. The adjustment layer restricts the channel layer from extending in a depth direction of the trench.

In a manufacturing method of a semiconductor device according to another aspect of the present disclosure, a semiconductor substrate having a main surface and including a drift layer of a first conductivity type is prepared, and a trench is defined in the semiconductor substrate from the main surface into the drift layer. A gate insulating layer covering a sidewall and a bottom wall of the trench is formed. When the gate insulating layer is formed, a sidewall insulating layer is formed on a sidewall of the trench, and a bottom wall insulating layer thicker than the sidewall insulating layer is formed on a bottom wall of the trench by selectively oxidizing the bottom wall of the trench after the forming the sidewall insulating layer. A channel layer is formed along the sidewall of the trench by introducing second conductivity type impurities from the sidewall of the trench using the bottom wall insulating layer as a mask. A gate electrode is formed in the trench after the gate insulating layer is formed.

BRIEF DESCRIPTION OF THE DRAWINGS

Additional objects and advantages of the present disclosure will be more readily apparent from the following detailed description when taken together with the accompanying drawings. In the drawings.

DETAILED DESCRIPTION

Figure 34:
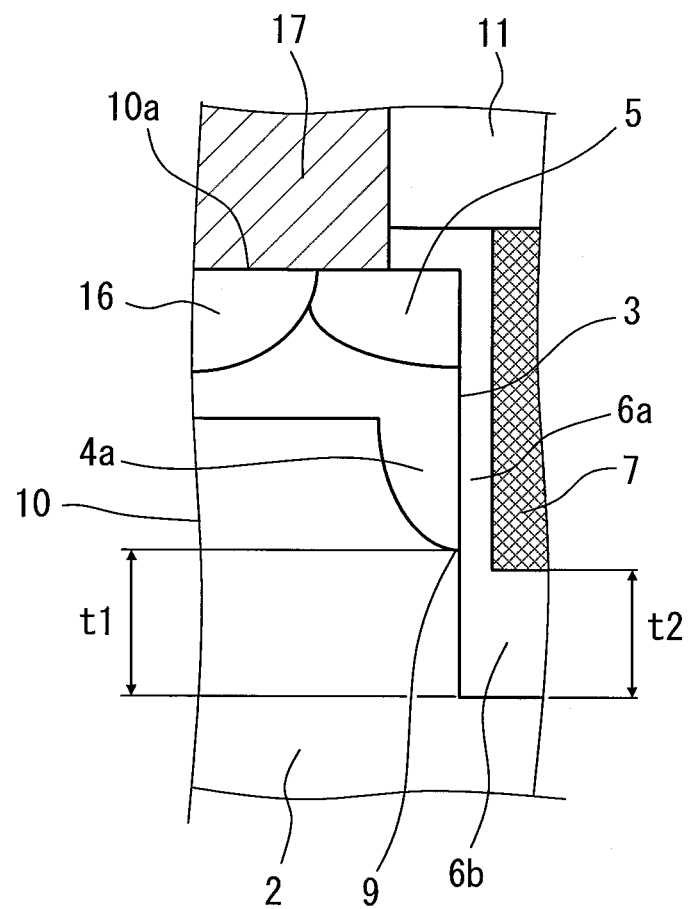
FIG. 34 is a cross-sectional view of a part of a semiconductor device having a trench gate structure.

Inventors of the present disclosure have found the following. In a semiconductor device having a trench gate structure, which is shown in FIG. 34, a cost and a performance of the semiconductor device depend on a gate projection length t1 between a lower end portion of a trench 3 and a lower end portion 9 of a channel layer 4a, that is, a position of the lower end portion 9 of the channel layer 4a in a depth direction. In order to manufacture a semiconductor device having stable properties with high yield, the gate projection length t1, which is an overlap margin, needs to be large. However, if the gate projection length t1 is too large, a mirror capacity may increase, and a switching delay and heat generation may be caused. In other words, a performance and a reliability of the semiconductor device may be reduced.

Therefore, a manufacturing method that can reduce variation in gate projection length t1 is required to balance a performance and a cost of a semiconductor device. In the manufacturing method disclosed in Japanese Patent No. 3,754,266, a thickness t2 of a bottom wall insulating layer 6b, which shown in FIG. 34, may easily vary. Accordingly, a gate projection length t1 may also vary.

In view of the foregoing, it is an object of the present disclosure is to provide a manufacturing method of a semiconductor device having a trench gate structure, which can reduce variation in gate projection length.

Embodiments of the present disclosure will be described below with reference to the accompanying drawings. In each figure, common or related components are assigned the same reference numeral. Semiconductor devices according to the embodiments of the present disclosure includes a transistor having a trench gate structure, such as a power metal-oxide semiconductor field-effect transistor (MOSFET) or insulated gate bipolar transistor (IGBT). A trench is defined on a main surface side of a semiconductor substrate. The trench is filled with a gate electrode so that a gate insulating layer is disposed between the semiconductor substrate and the gate electrode. In each of the following embodiments, a semiconductor device includes an n-channel type vertical MOSFET as an example.

First Embodiment

Figure 1:
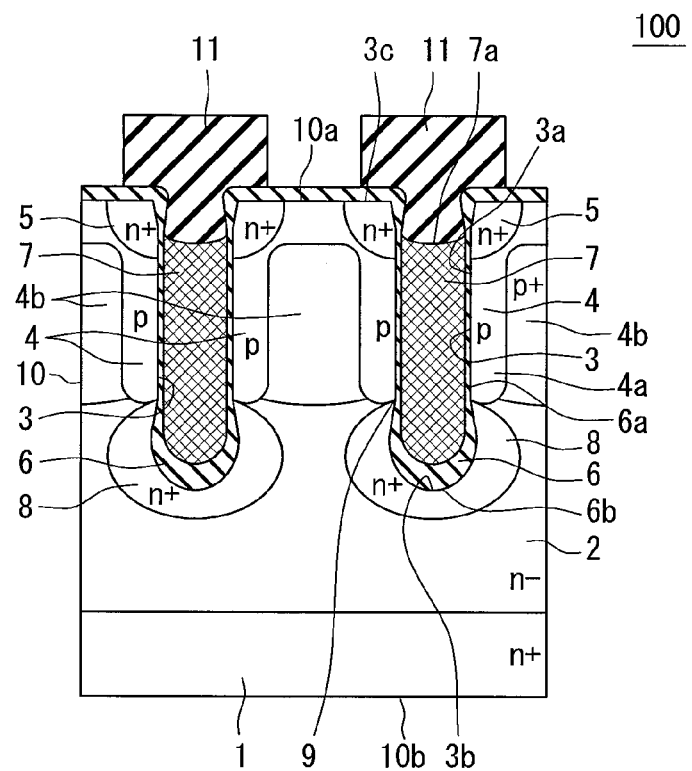
FIG. 1 is a cross-sectional view of a semiconductor device according to a first embodiment of the present disclosure.

A semiconductor device 100 according to a first embodiment of the present disclosure will be described. As shown in FIG. 1, the semiconductor device 100 includes a semiconductor substrate 10. The semiconductor substrate 10 includes a silicon substrate 1, a drift layer 2, a base layer 4, and a source layer 5. The semiconductor substrate 10 has a first main surface 10a and a second main surface 10b. The semiconductor substrate 10 defines a trench 3 from the first main surface 10a. A thickness direction of the semiconductor substrate 10 corresponds to a depth direction of the trench 3. The trench 3 penetrates the source layer 5 and the base layer 4 and reaches the drift layer 2.

The silicon substrate 1 is an n-conductivity type (n$^+$) substrate and can operate as a drain of a MOSFET. On the silicon substrate 1, the drift layer of the n-conductivity type (n$^-$) is epitaxially formed. An upper end of the drift layer 2 is positioned above a bottom wall 3b of the trench 3. The trench 3 is provided by digging the semiconductor substrate 10 from the first main surface 10a into the drift layer 2.

In the present embodiment, the n-conductivity type corresponds to a first conductivity type, and the p-conductivity type corresponds to a second conductivity type. In the following description, the thickness direction of the semiconductor substrate 10 is referred to as a vertical direction, a side of the first main surface 10a is referred to as an upper side, and a side of the second main surface 10b is referred to as a lower side.

On the drift layer 2, the base layer 4 of the p-conductivity type is formed. At a predetermined portion of the base layer 4, a high concentration body region 4b of the p-conductivity type ($p^+$) is formed. At a portion of the base layer 4 adjacent to each trench 3, a channel layer 4a of the p-conductivity type (p) is formed. The channel layer 4a can operate as a channel region. The channel layer 4a is formed at least on a sidewall 3a of the trench 3 between an adjustment layer 8 and the first main surface 10a. An upper end of the channel layer 4a is adjacent to the source layer 5 and a lower end of the channel layer 4a is adjacent to the adjustment layer 8. The high concentration body region 4b is formed between the channel layers 4a formed along the sidewalls 3a of the adjacent trenches 3, which are opposed to each other. The high concentration body region 4b extends to a depth similar to a lower end portion of the channel layer 4a. At a surface portion of the semiconductor substrate 10 adjacent to the first main surface 10a, a channel layer 4a that is shallower than the channel layer 4a adjacent to the trench 3 is formed.

The source layer 5 is an n-conductivity type ($n^+$) semiconductor region. The source layer 5 is formed on a portion of an inner wall of the trench 3 adjacent to the first main surface 10a. The source layer 5 is disposed at an upper end portion of the base layer 4. An upper end portion of the source layer 5 is located on the first main surface 10a of the semiconductor substrate 10 and a lower end portion of the source layer 5 is located at a position deeper than an upper end portion of a gate electrode 7.

The inner wall of the trench 3 is covered with a gate insulating layer 6. For example, the gate insulating layer 6 is made of silicon oxide layer. The gate insulating layer 6 covers the sidewall 3a, the bottom wall 3b, and an upper portion (a portion surrounding an opening) 3c of the trench 3. The gate insulating layer 6 includes a sidewall insulating layer 6a formed on the sidewall 3a of the trench 3 and a bottom wall insulating layer 6b formed on the bottom wall 3b of the trench 3. A thickness of the bottom wall insulating layer 6b is larger than a thickness of the sidewall insulating layer 6a. The bottom wall 3b includes corner portions of the trench 3 adjacent to the bottom. The bottom wall insulating layer 6b having a large thickness covers the bottom wall 3b. Accordingly, an electric field concentration at the corner portions of the bottom wall 3b of the trench 3 can be relaxed, and a breakdown voltage does not decrease at the corner portions.

In the trench 3, the gate electrode 7 is formed. For example, the gate electrode 7 may be made of polysilicon in which impurities are introduced after depositing non-doped polysilicon. The gate electrode 7 may also be made of doped polysilicon. In the trench 3, the gate insulating layer 6 is disposed between the gate electrode 7 and the semiconductor substrate 10. In the trench 3, an upper end portion 7a of the gate electrode 7 is located at position deeper than an open end of the trench 3, that is, an upper end portion of the trench 3. The source layer 5 is disposed from a position above the upper end portion 7a of the gate electrode 7 to a position below the upper end portion 7a of the gate electrode 7.

In the semiconductor substrate 10, the adjustment layer 8 is formed on the bottom wall 3b of the trench 3. The adjustment layer 8 has the n-conductivity type ($n^+$) in which impurities are doped with a higher concentration than the drift layer 2.

The adjustment layer 8 surrounds the bottom wall insulating layer 6b. An upper end portion of the adjustment layer 8 is positioned on an upper end portion of the bottom wall 3b of the trench 3, that is, an end of the corner portion of the bottom wall 3b, which is formed as a curved portion.

The adjustment layer 8 defines the bottom wall 3b of the trench 3. On the inner wall of the trench 3, the upper end portion of the adjustment layer 8 is adjacent to the lower end portion 9 of the channel layer 4a. The adjustment layer 8 restricts the channel layer 4a from extending in the depth direction, and the lower end portion 9 of the channel layer 4a is not displaced downward. The lower end portion 9 of the channel layer 4a is a lower end of a portion of the channel layer 4a formed along the sidewall 3a of the trench 3 and adjacent to the sidewall 3a.

On the first main surface 10a of the semiconductor substrate 10, an interlayer insulating layer 11 is formed from above the gate electrode 7 to above the channel layer 4a and the source layer 5. For example, the interlayer insulating layer 11 is made of boron phosphorus silicon glass (BPSG). The interlayer insulating layer 11 defines contact holes. A source electrode (not shown) and the like are coupled through the contact holes. On the second main surface 10b of the semiconductor substrate 10, a drain electrode (not shown) is formed.

A manufacturing method of the semiconductor device 100 according to the present embodiment will be described with reference to FIG. 2 to FIG. 8.

Figure 2:
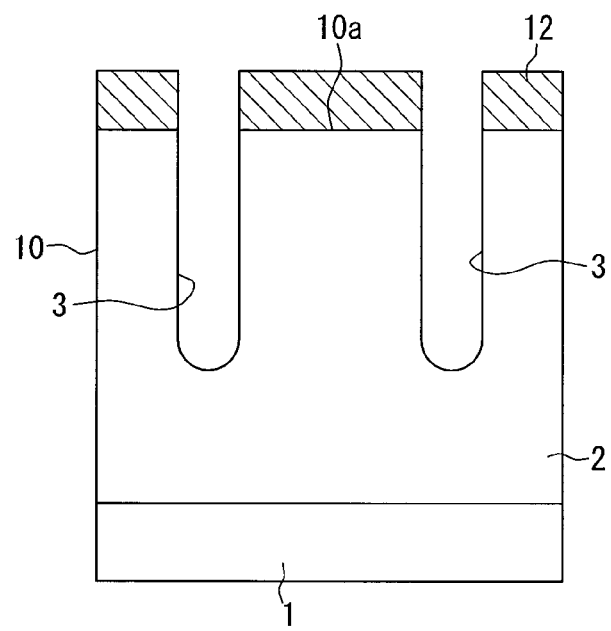
FIG. 2 is a diagram showing a manufacturing process of the semiconductor device according to the first embodiment.

In a process shown in FIG. 2, the drift layer 2 and the trench 3 are formed. Firstly, the silicon substrate 1 of the n-conductivity type ($n^+$) is prepared. On the silicon substrate 1, the drift layer 2 of the n-conductivity type ($n^-$) is epitaxially formed. Accordingly, the drift layer 2, which can operate as the drift region, is formed at a region where the trench 3 is to be formed. Then, on the first main surface 10a of the semiconductor substrate 10, a resist mask (hard mask) 12 is formed. For example, the resist mask 12 is made of $SiO_2$. The resist mask 12 defines an opening at a position where the trench 3 is to be formed. For example, the resist mask 12 can be formed by depositing $SiO_2$ and the like by a CVD method and patterning the deposited $SiO_2$ by photolithography or anisotropic dry etching. Then, by anisotropic dry etching and the like using the resist mask 12, the trench 3 is defined in the semiconductor substrate 10. The trench 3 extends in the thickness direction of the semiconductor substrate 10 to a predetermined depth (for example, 1 μm to 4 μm).

Figure 3:
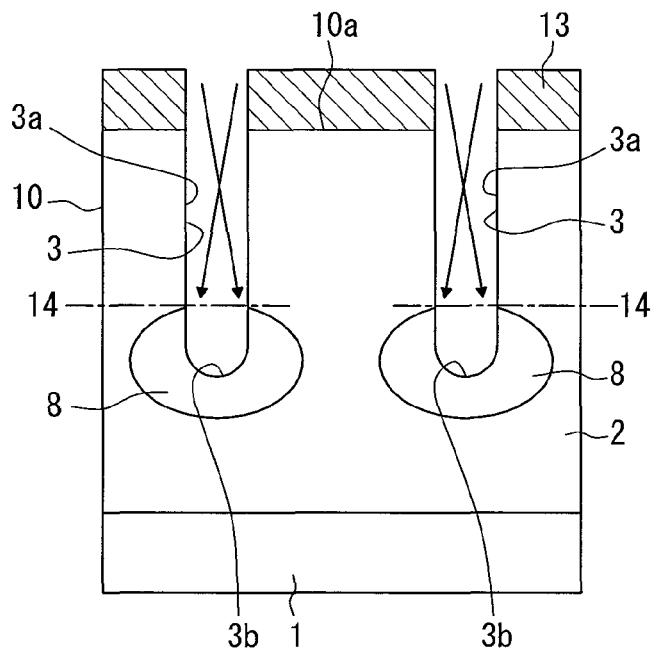
FIG. 3 is a diagram showing a manufacturing process of the semiconductor device according to the first embodiment.

After forming the drift layer 2 and the trench 3, the adjustment layer 8 is formed as shown in FIG. 3. In the present process, firstly, a resist mask 13 for blocking impurity introduction is disposed on the first main surface 10a of the semiconductor substrate 10 except for a region where the trench 3 is formed. Then, impurities are introduced into the trench 3.

Specifically, n-conductivity type impurities are introduced to a region lower than a boundary line 14, which is shown by a dashed-dotted line, so as to be higher concentration than the drift layer 2. For example, the impurities are introduced obliquely by ion implantation. When the impurity ions are implanted obliquely to the depth direction of the trench 3, that is, the thickness direction of the semiconductor substrate 10, the adjustment layer 8 can be formed to expand in both directions at a portion adjacent to the corner portions of the bottom wall 3b. The boundary line 14 is a boundary between the bottom wall 3b and the sidewall 3a of the trench 3. When impurities are introduced by ion implantation, the impurity ions are implanted to the region lower than the boundary line 14. When the sidewall 3a of the trench 3 is inclined in such a manner that a width of the trench 3 increases upward, the impurity ions may be implanted in the depth direction of the trench 3.

The adjustment layer 8 may also be formed by a different method that can introduce impurities to the bottom wall 3b at a high concentration. For example, after forming the trench 3, polysilicon in which impurities are doped at a high concentration may be selectively disposed adjacent to the bottom wall 3b of the trench 3 and the adjustment layer 8 may be formed at a predetermined position adjacent to the bottom wall 3b by thermal diffusion.

Figure 4:
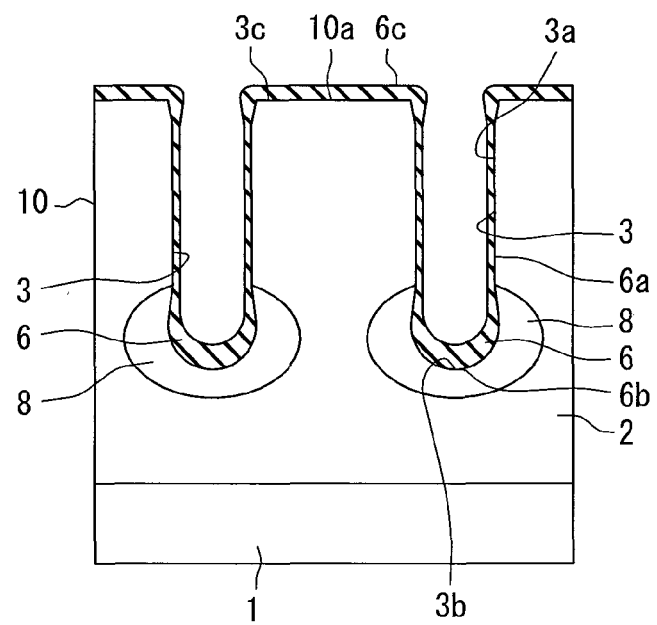
FIG. 4 is a diagram showing a manufacturing process of the semiconductor device according to the first embodiment.

After forming the adjustment layer 8, the gate insulating layer 6 is formed as shown in FIG. 4. In the present process, the gate insulating layer 6 is formed to cover the sidewall 3a and the bottom wall 3b of the trench 3. The gate insulating layer 6 includes the sidewall insulating layer 6a formed on the sidewall 3a, the bottom wall insulating layer 6b formed on the bottom wall 3b, and an upper insulating layer 6c formed on the upper portion 3c of the trench 3. The thickness of the bottom wall insulating layer 6b is larger than the thickness of the sidewall insulating layer 6a. The thickness of the sidewall insulating layer 6a may be within a range from 300 Å to 1000 Å. The thickness of the bottom wall insulating layer 6b and the thickness of the upper insulating layer 6c may be larger than the thickness of the sidewall insulating layer 6a and may be within a range from 1000 Å to 2000 Å.

A thick layer can be partially formed on the bottom wall 3b by various known methods. In an example, a thick layer may be partially formed by a LOCOS method. In another example, an insulating layer may deposited in the trench 3, and a buried layer may be formed by etch back. In another example, anisotropic oxidation may be performed by plasma oxidation. In another example, boron and the like may be introduced to a portion of the adjustment layer 8 and propagate oxidation may be performed by thermal diffusion. The gate insulating layer 6 may be formed by methods disclosed in JP-A-2008-4686, JP-A-2003-8018, and JP-A-2001-196587. In cases where the bottom wall insulating layer 6b and the upper insulating layer 6c are appropriately formed, a drain breakdown voltage and a gate breakdown voltage can be increased, the performance can be improved, and the reliability can be secured.

Figure 5:
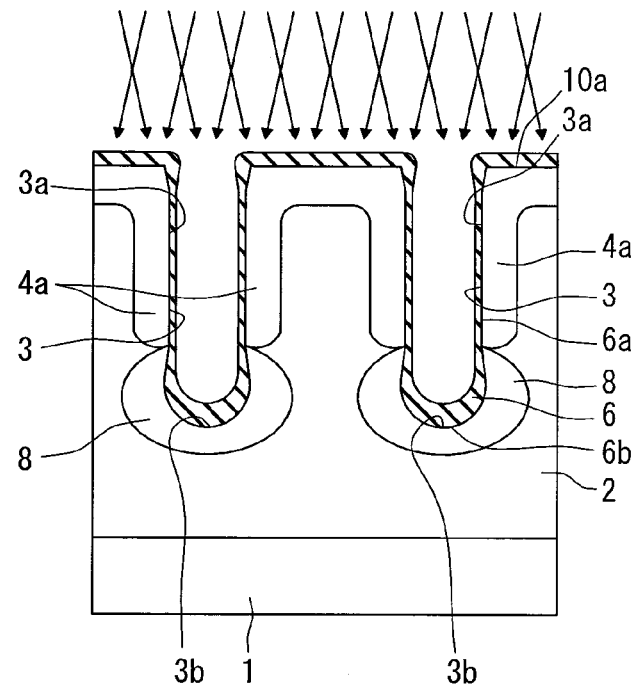
FIG. 5 is a diagram showing a manufacturing process of the semiconductor device according to the first embodiment.

After forming the gate insulating layer 6, the channel layer 4a is formed as shown in FIG. 5. In the present process, p-conductivity type impurities are introduced to the sidewall 3a of the trench 3 and the first main surface 10a of the semiconductor substrate 10. Accordingly, the channel layer 4a is formed between the adjustment layer 8 and the first main surface 10a. In the present process, the impurities are implanted to the sidewall 3a of the trench 3, for example, by ion implantation, using the bottom wall insulating layer 6b formed on the bottom wall 3b as a mask. When the ion implantation is performed, the impurities may be implanted obliquely to the depth direction of the trench 3. Accordingly, the impurities can be appropriately introduced to the first main surface 10a and the sidewall 3a of the trench 3. In the present process, the adjustment layer 8, which has already been formed, restrict the channel layer 4a from extending in the depth direction.

In an example shown in FIG. 5, the channel layer 4a is formed on the sidewall 3a of the trench 3 and the first main surface 10a of the semiconductor substrate 10. In cases where an interval of the adjacent trenches 3 is small and a width of a mesa region between the adjacent trenches 3 is small, the channel layer 4a may be formed uniformly in the mesa region.

Figure 6:
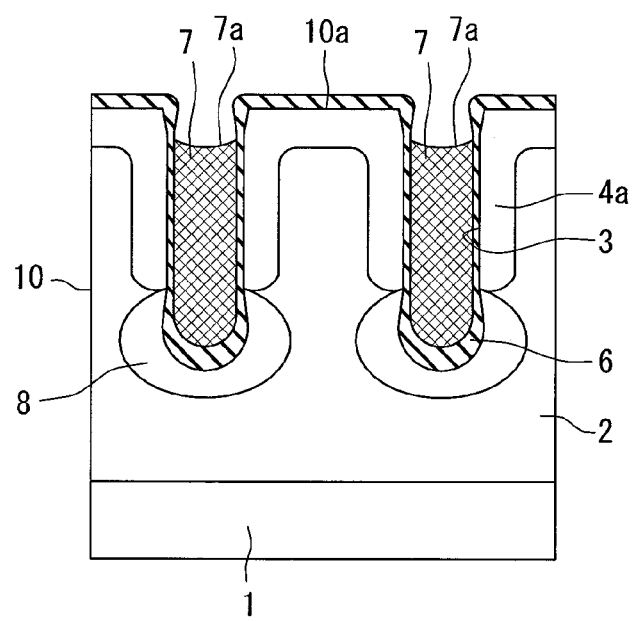
FIG. 6 is a diagram showing a manufacturing process of the semiconductor device according to the first embodiment.

After forming the channel layer 4a, the gate electrode 7 is formed as shown in FIG. 6. In the present process, the trench 3 is filled with doped polysilicon by a low pressure chemical vapor deposition (LPCVD) method and the polysilicon is etched back to have a predetermined thickness. Accordingly, the gate electrode 7 is formed. In the present process, the gate electrode 7 is formed in such a manner that an upper end portion 7a of the gate electrode 7 is located at a position deeper than the open end of the trench 3.

Figure 7:
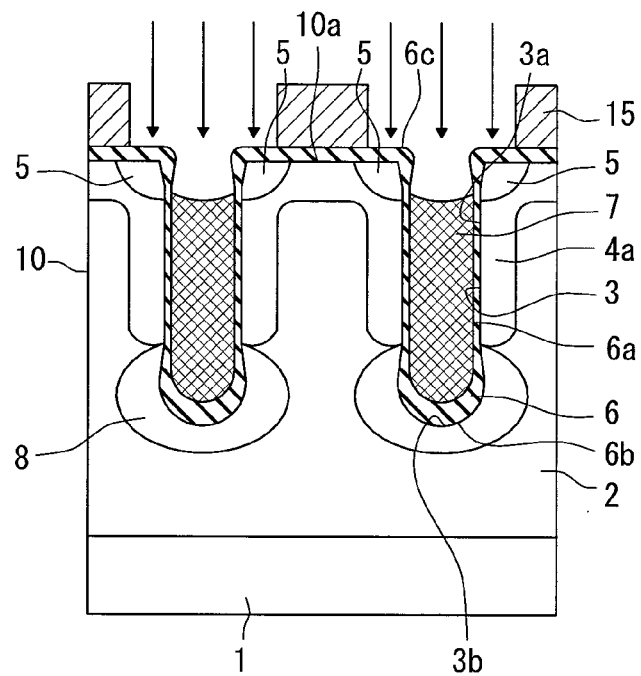
FIG. 7 is a diagram showing a manufacturing process of the semiconductor device according to the first embodiment.

After the gate electrode 7 is formed, the source layer 5 is formed as shown in FIG. 7. In the present process, a resist mask 15 for blocking impurity introduction is formed at a predetermined position other than a position adjacent to the open end of the trench 3. Then, n-conductivity type impurities are introduced into the first main surface 10a of the semiconductor substrate 10 by ion implantation. Accordingly, the source layer 5 having a predetermined depth is formed.

In the present embodiment, the thickness of the gate insulating layer 6 decreases downward at a portion adjacent to the upper end portion of the trench 3, and the thickness of the gate insulating layer 6 is constant at a position lower than a predetermined position. The source layer 5 is deeper than the upper end portion 7a of the gate electrode 7 and reaches a position where the thickness of the gate insulating layer 6 is constant. As described above, because the upper end portion 7a of the gate electrode 7 is deeper than the open end of the trench 3, the n-conductivity type impurities are easily implanted not only from the first main surface 10a but also from the sidewall 3a of the trench 3. Accordingly, the source layer 5 can be easily formed to the predetermined depth on the sidewall 3a of the trench 3.

Figure 8:
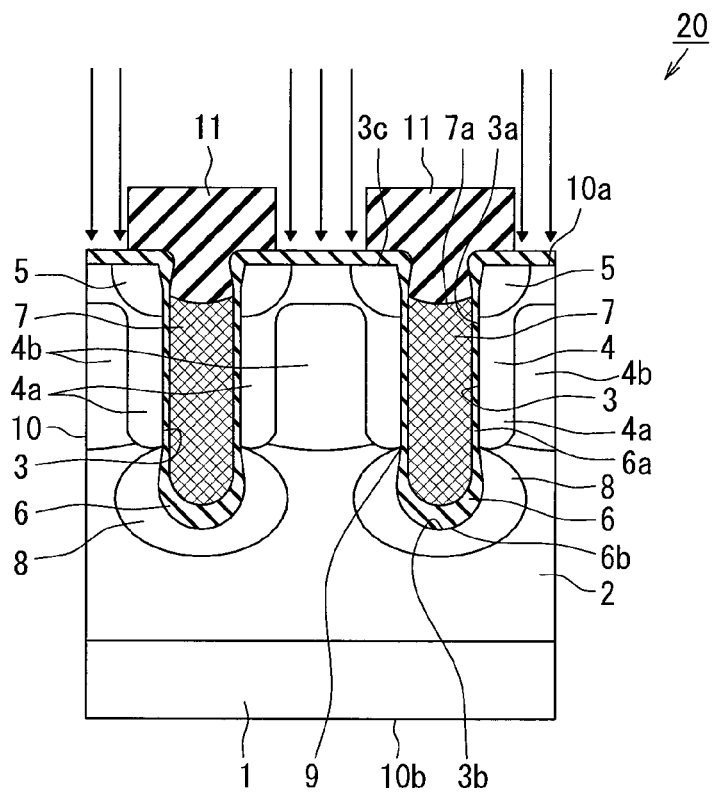
FIG. 8 is a diagram showing a manufacturing process of the semiconductor device according to the first embodiment.

After forming the source layer 5, the resist mask 15 is removed, and the high concentration body region 4b is formed as shown in FIG. 8. A mask material, such as $SiO_2$, is formed as a hard mask to cover the trench 3 and the portion adjacent to the open end of the trench 3. Then, p-conductivity type impurities are introduced into the semiconductor substrate 10 from the first main surface 10a by ion implantation. In the present embodiment, the p-conductivity type impurities are implanted at a higher concentration than the channel layer 4a so that the high concentration body region 4b is formed at a position adjacent to the channel layer 4a to a depth similar to the lower end portion 9 of the channel layer 4. In other words, the high concentration body region 4b is shallower than the trench 3. In cases where a mask material, such as $SiO_2$, is used as a hard mask, the mask material may be left as the interlayer insulating layer 11. In cases where an organic resist is used as a mask, the organic resist may be removed after the high concentration body region 4b is formed, and the interlayer insulating layer 11 made of BPSG and the like may be formed.

After the interlayer insulating layer 11 is formed, the contact holes are provided, for example, by photolithography or anisotropic dry etching, and a metal layer for forming the source electrode and the like is formed, for example, by spattering. In addition, the drain electrode is formed on the second main surface 10b of the semiconductor substrate 10. By the above-described processes, the semiconductor device 100 shown in FIG. 1 can be formed.

Next, effects of the manufacturing method of the semiconductor device 100 according to the present embodiment will be described.

In the manufacturing method according to the present embodiment, the adjustment layer 8 is formed on the bottom wall 3b of the trench 3 defined by the semiconductor substrate 10. In the adjustment layer 8, the n-conductivity type impurities are introduced at higher concentration than the drift layer 2. On the sidewall 3a of the trench 3, the p-conductivity type impurities are introduced between the adjustment layer 8 and the first main surface 10a. Accordingly, the channel layer 4a is formed while restricting extension in the depth direction by the adjustment layer 8. In the adjustment layer 8, the n-conductivity type impurities, which are opposite polarity to the channel layer 4a, are introduced at the high concentration. Thus, the adjustment layer 8 can effectively restrict the channel layer 4a from sinking. Specifically, after implanting impurities for forming the channel layer 4a, the adjustment layer 8 restricts the channel layer 4a from diffusing downward in a heat treatment. Thus, the lower end portion 9 of the channel layer 4a is not displaced downward. In this way, variation in position of the lower end portion 9 in the depth direction, that is, variation in gate projection length can be reduced. The gate projection length is a distance between the lower end portion of the trench 3 and the lower end portion 9 of the channel layer 4a. Accordingly, a reduction of device performance due to increase in the depth of the channel layer 4a can be reduced.

In the process of forming the channel layer 4a, the impurities are implanted obliquely to the depth direction of the trench 3. Thus, the impurities can be effectively implanted to the sidewall 3a of the trench 3. In particular, when the impurities are implanted from the sidewall 3a of the trench 3, an impurity profile in a depth direction can be uniform at a portion adjacent to the sidewall 3a of the trench 3. Accordingly, variation in gate threshold voltage can be easily reduced.

In the present embodiment, before forming the channel layer 4a, the gate insulating layer 6 is formed so that the thickness of the bottom wall insulating layer 6b is larger than the thickness of the sidewall insulating layer 6a. Accordingly, a mask property of the bottom wall insulating layer 6b at a time when the channel layer 4a is formed can be high, and the channel layer 4a can be formed while restricting impurity introduction to the bottom wall 3b. As a result, a resist process for forming the channel layer 4a is not required. In addition, when the channel layer 4a is formed, the channel layer 4a, which is self-aligned using the bottom wall insulating layer 6b as a mask, determines the gate projection length. Thus, variation in gate projection length due to a resist process can be removed. In this way, the channel layer 4a can be formed at a predetermined position with accuracy not only by the adjustment layer 8 but also by the bottom wall insulating layer 6b. Furthermore, the bottom wall insulating layer 6b restricts the p conductivity type impurities from being introduced to the adjustment layer 8. After introducing the impurities for forming the channel layer 4a, the adjustment layer 8 restricts the channel layer 4a from sinking. Therefore, variation in gate projection length can be effectively reduced.

In the process of forming the gate electrode 7, the upper end portion 7a of the gate electrode 7 is located at the position deeper than the open end of the trench 3. After forming the gate electrode 7, the source layer 5 is formed by implanting n-conductivity type impurities at least from the sidewall 3a of the trench 3. Accordingly, the upper end portion 7a of the gate electrode 7 can be a reference of the depth of the source layer 5, and the source layer 5 adjusted to the upper end portions of the gate electrode 7 and the trench 3 can be formed.

In the semiconductor substrate 10, the high concentration body region 4b is formed at the position adjacent to the channel layer 4a to the depth similar to the lower end portion 9 of the channel layer 4a. Accordingly, effects as a junction field effect transistor (JFET) can be reduced compared with a configuration in which the high concentration body region 4b is not provided. Furthermore, a potential of the channel layer 4a can be stabilized. In addition, because the base layer 4, that is, the channel layer 4a and the high concentration body region 4b are shallower than the trench 3, a breaking position can be at the lower end portion of the trench 3. Accordingly, the drain breakdown voltage can be improved.

In the present embodiment, the semiconductor device 100 is formed in the order of the trench 3, the adjustment layer 8, the gate insulating layer 6, the channel layer 4a, and the gate electrode 7. The effect of the adjustment layer 8 is to restrict the channel layer 4a from sinking by diffusion after the adjustment layer 8 is formed. Thus, for example, the semiconductor device 100 may also be formed in the order of the trench 3, the gate insulating layer 6, the adjustment layer 8, the channel layer 4a, and the gate electrode 7. The semiconductor device 100 may also be formed in the order of the trench 3, the adjustment layer 8, the channel layer 4a, the gate insulating layer 6, and the gate electrode 7. As long as the adjustment layer 8 is formed before the channel layer 4a, the adjustment layer 8 can reduce the channel layer 4a from sinking during the heat treatment for forming the channel layer 4a.

Second Embodiment

A manufacturing method of a semiconductor device 100 according to the present embodiment will be described with reference to FIG. 9A to FIG. 12B. In the present embodiment, a structure of a channel layer 4a and a process of forming the channel layer 4a are different from the first embodiment. Structure of the other components and the other processes are similar to the first embodiment.

In the present embodiment, the channel layer 4a is formed before forming the adjustment layer 8. In a process shown in FIG. 9A, a semiconductor substrate 10 is prepared. In a manner similar to the first embodiment, a drift layer 2 of the n-conductivity type (n$^-$) is formed on a silicon substrate 1 of the n-conductivity type (n$^+$). On an opposite side of the drift layer 2 from the silicon substrate 1, the channel layer 4a of the p-conductivity type is formed, for example, by ion implantation. In other words, the channel layer 4a is formed in the whole area of a first main surface 10a of the semiconductor substrate by implanting p-conductivity type impurities. Accordingly, the semiconductor substrate 10, in which the drift layer 2 of the n-conductivity type is located on a bottom side of a region where the trench 3 is to be defined, is prepared. Then, as shown in FIG. 9B, a trench 3 is defined from the first main surface 10a of the semiconductor substrate 10 into the drift layer 2.

Figure 9A:
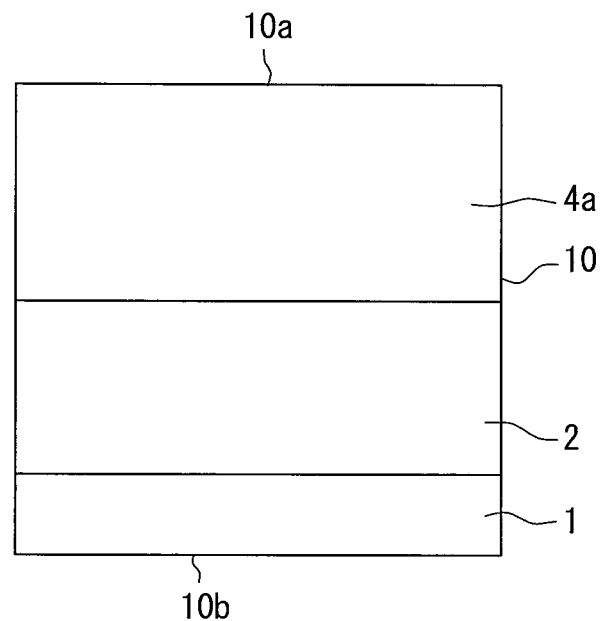
FIG. 9A and FIG. 9B are diagrams showing manufacturing processes of a semiconductor device according to a second embodiment of the present disclosure.
Figure 9B:
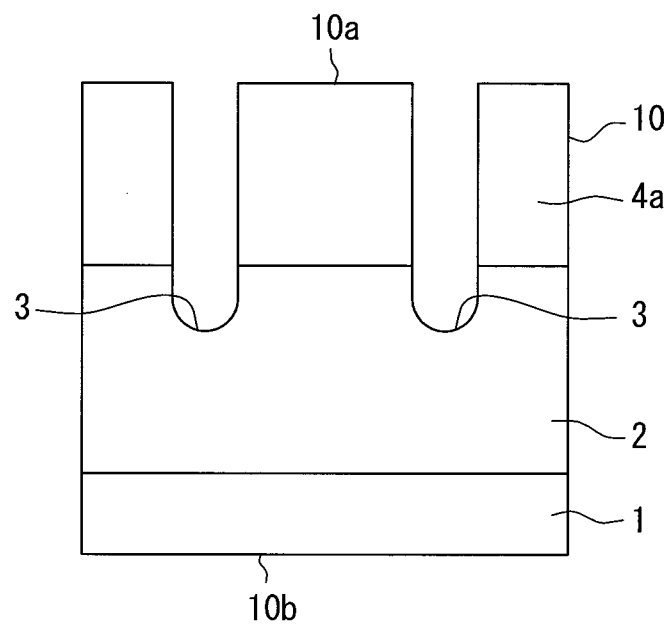

In the present embodiment, the trench 3 shown in FIG. 9B is formed by etching, such as reactive ion etching (RIE) using Cl or Br-based gas, in which etching rate depends on a carrier polarity and a concentration. Specifically, the above-described etching is performed to a region of the semiconductor substrate 10 where the trench 3 is to be defined, and the etching rate is monitored during the etching. In FIG. 9B, a mask is not shown.

Figure 10:
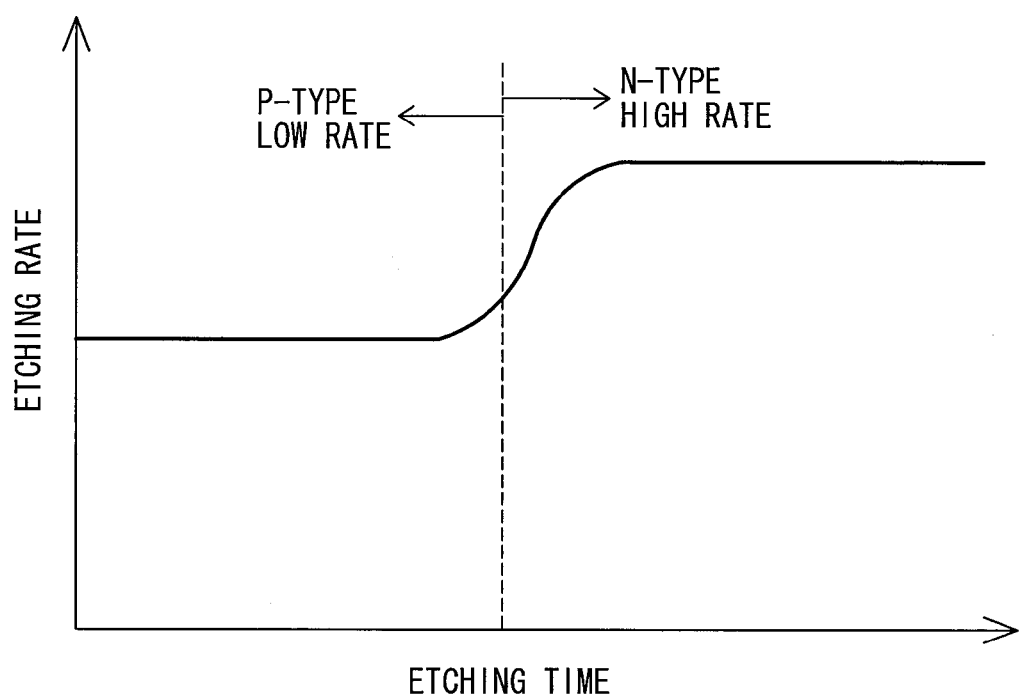
FIG. 10 is a graph for explaining a change in etching rate.

In the present example, as shown in FIG. 10, while the channel layer 4a of the p-conductivity type is etched, the etching rate is maintained at about a first rate. While the drift layer 2 of the n-conductivity type is etched, the etching rate becomes about a second rate that is larger than the first rate. In the present embodiment, the difference between the etching rates is used. A time point at which a predetermined change of the etching rate occurs is detected, and the etching is finished at the time point or a time when a predetermined time has elapsed after the time point. The predetermined change of the etching rate may be a change of the etching rate from the first rate by a predetermined ratio or a change of the etching rate from the first rate by a predetermined value. Accordingly, the bottom wall 3b of the trench 3 and the lower end of the channel layer 4a may be arranged at predetermined positions.

Figure 11A:
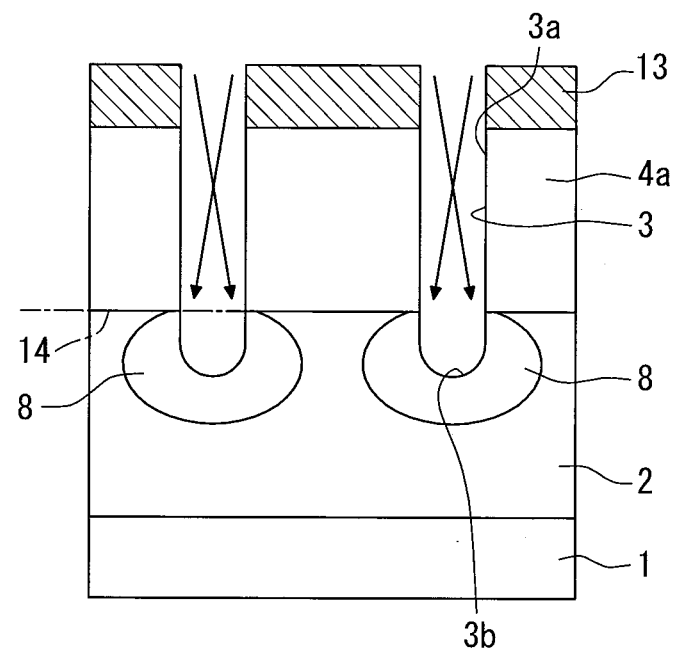
FIG. 11A and FIG. 11B are diagrams showing manufacturing processes of the semiconductor device according to the second embodiment.
Figure 11B:
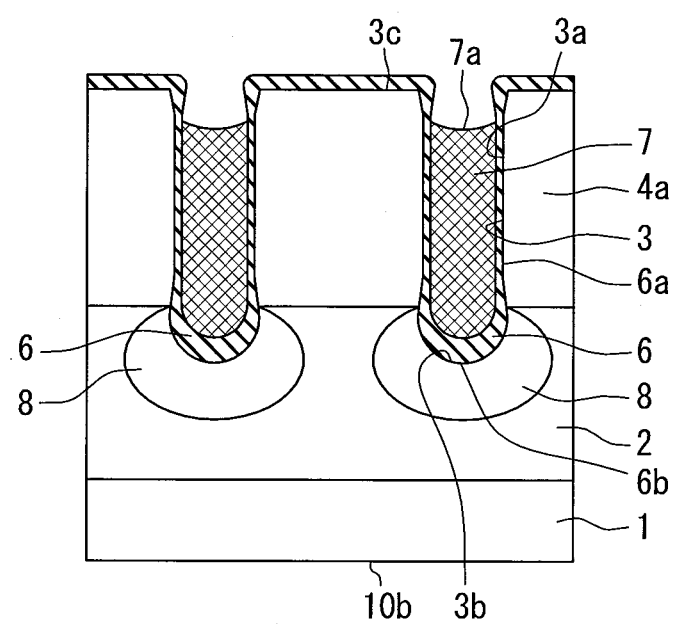

After forming the trench 3, the adjustment layer 8 is formed as shown in FIG. 11A. The adjustment layer 8 may be formed in a manner similar to the manufacturing process of the adjustment layer 8, which has been described with reference to FIG. 3. In the present embodiment, impurities are implanted to a portion lower than the boundary line 14 so that the adjustment layer 8 is formed at the portion lower than the boundary line 14 between the channel layer 4a and the drift layer 2. Also in the present embodiment, the adjustment layer 8 is formed adjacent to the channel layer 4a. Thus, after the adjustment layer 8 is formed, the adjustment layer 8 can restrict the channel layer 4a from extending in the depth direction.

Figure 12A:
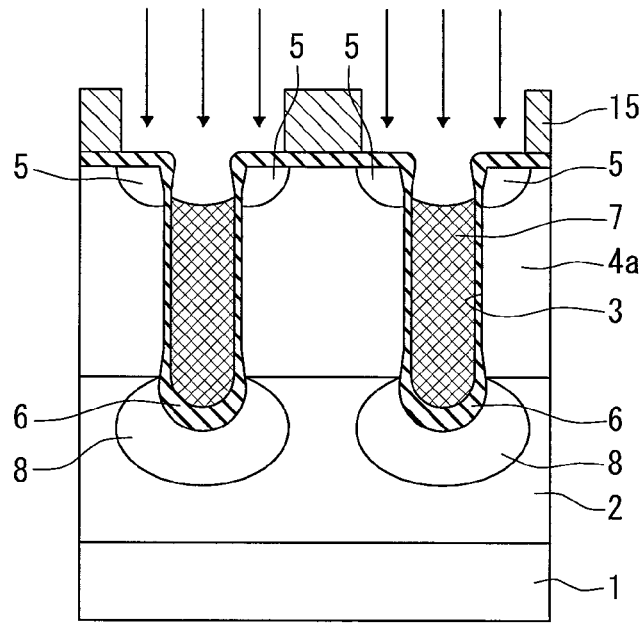
FIG. 12A and FIG. 12B are diagrams showing manufacturing processes of the semiconductor device according to the second embodiment.

After forming the adjustment layer 8, the gate insulating layer 6 is formed in a manner similar to the method described in the first embodiment with reference to FIG. 4. Next, the gate electrode 7 is formed in a manner similar to the method described in the first embodiment with reference to FIG. 6. Then, as shown in FIG. 12A, the source layer 5 is formed in a manner similar to the method described in the first embodiment with reference to FIG. 7.

Figure 12B:
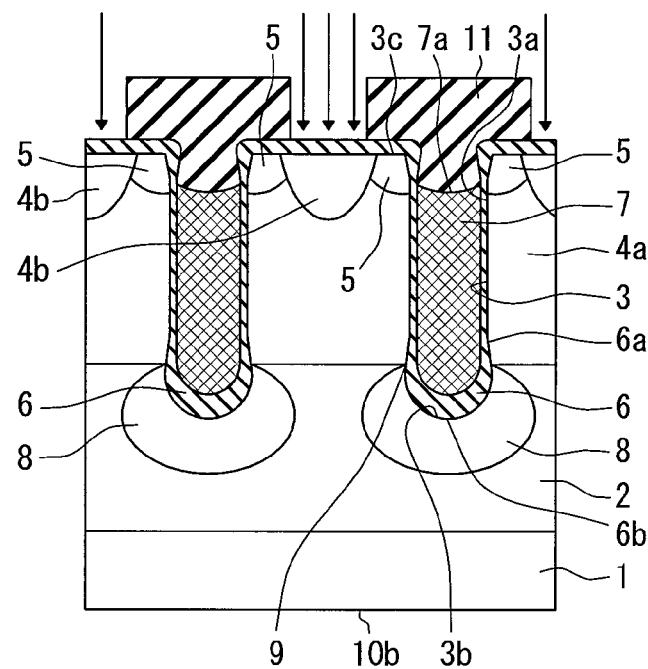

After forming the source layer 5, the resist mask 15 is removed, and the high concentration body region 4b is formed as shown in FIG. 12B. The high concentration body region 4b may be formed in a manner similar to the method described in the first embodiment. For example, as shown in FIG. 12B, a mask material, such as $SiO_2$, is formed as a hard mask to cover the trench 3 and a portion adjacent to the open end of the trench 3, and p-conductivity type impurities are introduced, for example, by ion implantation. Also in the present embodiment, the high concentration body region 4b is formed at the portion adjacent to the channel layer 4a to a position shallower than the lower end portion of the channel layer 4a by implanting the p-conductivity type impurities at higher concentration than the channel layer 4a. In the present embodiment, the hard mask is maintained as the interlayer insulating layer 11 as an example. Subsequently, contact holes are defined in the interlayer insulating layer 11, for example, by photolithography or anisotropic dry etching, and a metal layer for forming a source electrode and the like is formed by spattering. Then, a drain electrode is formed on the second main surface of the semiconductor substrate 10. Accordingly, the semiconductor device 100 can be formed.

Also in the present embodiment, the adjustment layer 8, in which the n-conductivity type impurities are introduced at a high concentration, can effectively restrict the channel layer 4a of the p-conductivity type, in particular, a portion of the channel layer 4a adjacent to the sidewall 3a of the trench 3, from sinking.

In the present embodiment, before forming the trench 3, the channel layer 4a is formed by introducing the p-conductivity type impurities from the first main surface 10a of the semiconductor substrate 10 so that the channel layer 4a is shallower than a depth of a region where the trench 3 is to be formed. After forming the channel layer 4a, the trench 3 is formed by the etching method in which the etching rate of the channel layer 4a is different from the etching rate of the drift layer 2. In the process of forming the trench 3, a finish time of the etching is determined by detecting a change in etching rate. Accordingly, an end position of the trench 3 can be determined while detecting the boundary line 14 between the channel layer 4a and the drift layer 2, and positioning of the bottom wall insulating layer 6b and the upper insulating layer 6c with respect to the channel layer 4a and positioning of the lower end portion of the trench 3 with respect to the lower end portion 9 of the channel layer 4a can be easily performed. Because the adjustment layer 8 is formed adjacent to the channel layer 4a at the region lower than the boundary line 14 between the channel layer 4a and the drift layer 2, the lower end portion 9 of the channel layer 4a is not displaced downward. Accordingly, variation in depth of the channel layer 4a, that is, variation in gate projection length can be reduced. Thus, a reduction of device performance due to increase in the depth of the channel layer 4a can be reduced.

In the present embodiment, the semiconductor device 100 is formed in the order of the channel layer 4a, the trench 3, the adjustment layer 8, the gate insulating layer 6, and the gate electrode 7. However, the semiconductor device 100 may also be formed in the order of the channel layer 4a, the trench 3, the gate insulating layer 6, the adjustment layer 8, and the gate electrode 7. The semiconductor device 100 may also be formed in the order of the trench 3, the adjustment layer 8, the gate insulating layer 6, the channel layer 4a, and the gate electrode 7. The semiconductor device 100 may also be formed in the order of the trench 3, the adjustment layer 8, the channel layer 4a, the gate insulating layer 6, and the gate electrode 7.

Third Embodiment

A manufacturing method of a semiconductor device 100 according to a third embodiment of the present disclosure will be described. In the present embodiment, variation in thickness of the bottom wall insulating layer 6b is reduced, and thereby variation in gate projection length is reduced.

Figure 13:
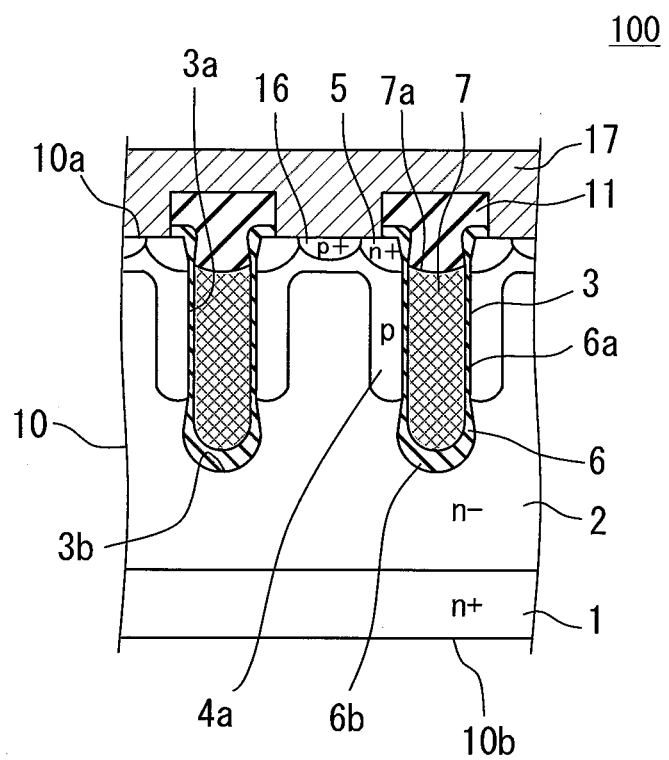
FIG. 13 a cross-sectional view of a semiconductor device according to a third embodiment of the present disclosure.

As shown in FIG. 13, the semiconductor device 100 according to the present embodiment has a structure basically similar to the semiconductor device 100 shown in FIG. 1. However, the semiconductor device 100 according to the present embodiment does not include the adjustment layer 8 and the high concentration body region 4b, and include a body contact region 16.

The semiconductor device 100 shown in FIG. 13 includes a semiconductor substrate 10 that includes a silicon substrate 1, a drift layer 2, a channel layer 4a, and a source layer 5. The semiconductor device 100 defines a trench 3 extending from a first main surface 10a of the semiconductor substrate 10 in a thickness direction of the semiconductor substrate 10.

The silicon substrate 1 is an n-conductivity type ($n^+$) substrate that can operate as a drain region of a MOSFET. On the silicon substrate 1, the drift layer 2 of the n-conductivity type ($n^-$) is epitaxially formed. The trench 3 opens on the first main surface of the semiconductor substrate 10. The trench 3 penetrates the source layer 5 into the drift layer 2. In the trench 3, a gate electrode 7 made of polysilicon, which is a conductive material, is disposed through a gate insulating layer 6 formed on an inner wall of the trench 3.

The gate insulating layer 6 includes a sidewall insulating layer 6a formed on a sidewall 3a of the trench 3 and a bottom wall insulating layer 6b formed on a bottom wall 3b of the trench 3. A thickness of the bottom wall insulating layer 6b is larger than a thickness of the sidewall insulating layer 6a. The bottom wall insulating layer 6b may be formed by selectively oxidizing the bottom wall 3b of the trench 3. Then, p-conductivity type impurities are introduced from the sidewall 3a of the trench 3 to the drift layer 2 of the n-conductivity type ($n^-$) using the bottom wall insulating layer 6b as a mask to form the channel layer 4a of the p-conductivity type (p) along the sidewall 3a of the trench 3. The channel layer 4a includes portions formed along the sidewall 3a of the trench 3 and a shallow portion coupling the adjacent portions formed along the sidewall 3a.

The source layer 5 of the n-conductivity type (n⁺) is formed at a region adjacent to the sidewall 3a of the trench 3 and above the channel layer 4a. The body contact region 16 of the p-conductivity type (p⁺) is adjacent to the source layer 5. The body contact region 16 is located midway between the adjacent trenches 3. The source layer 5 and the body contact region 16 are coupled with a source electrode 17.

Next, a manufacturing method of the semiconductor device 100 shown in FIG. 13 will be described with reference to FIG. 14 to FIG. 19.

Firstly, the semiconductor substrate 10, in which the drift layer 2 of the n-conductivity type (n⁻) is epitaxially formed on the silicon substrate 1 of the n-conductivity type (n⁺) is prepared.

Figure 14A:
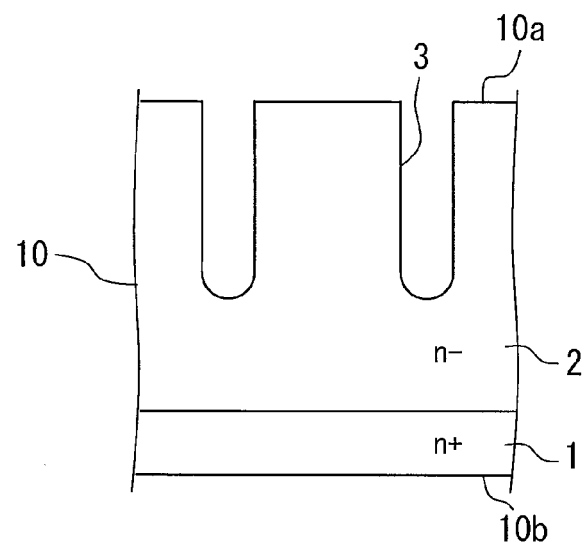
FIG. 14A to FIG. 14C are diagrams showing manufacturing processes of the semiconductor device according to the third embodiment.

Next, a mask having a predetermined opening portion and made of resist or oxide layer is formed on the first main surface 10a of the semiconductor substrate 10. Then, as shown in FIG. 14A, the trench 3 is defined in the semiconductor substrate 10 by etching the drift layer 2. In cases where a hard mask made of oxide layer is used in the etching, the hard mask may be left on the first main surface 10a after forming the trench 3.

Figure 14B:
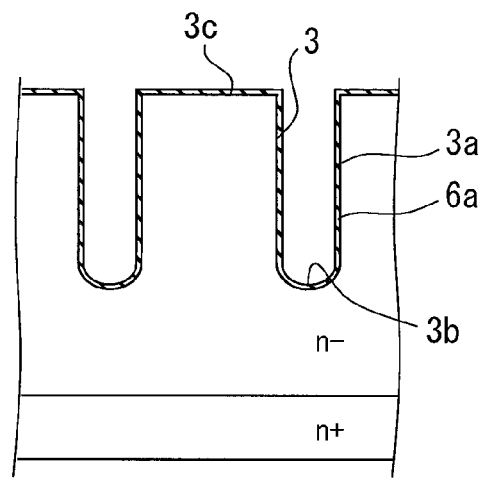

Next, as shown in FIG. 14B, the semiconductor substrate 10, in which the trench 3 is defined, is thermally oxidized to form the sidewall insulating layer 6a on the sidewall 3a of the trench 3. At this time, an insulating layer is also formed on the bottom wall 3b of the trench 3 and the upper portion 3c of the trench 3 (first main surface 10a).

Figure 14C:
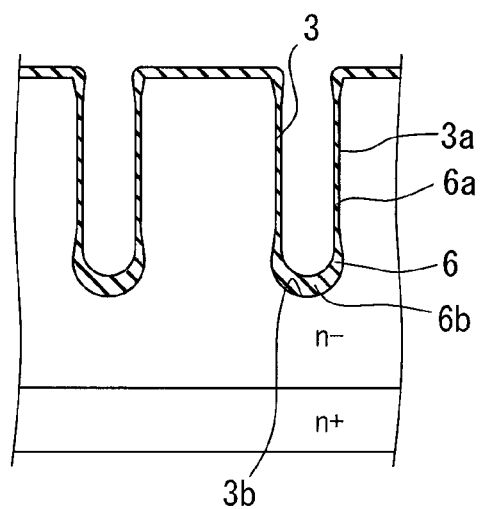

Subsequently, as shown in FIG. 14C, the bottom wall 3b of the trench 3 is selectively oxidized so that bottom wall insulating layer 6b thicker than the sidewall insulating layer 6a is formed.

The process of selectively oxidizing the bottom wall 3b of the trench 3 will be described with reference to FIG. 15 and FIG. 16.

In the process of forming the bottom wall insulating layer 6b, a local oxidation of silicon (LOCOS) method, which is normally performed on the first main surface 10a of the semiconductor substrate 10, is applied to the selective oxidation of the bottom wall 3b of the trench 3.

After forming the sidewall insulating layer 6a, a nitride layer 18 is deposited in the whole area of the first main surface 10a of the semiconductor substrate 10.

Figure 15A:
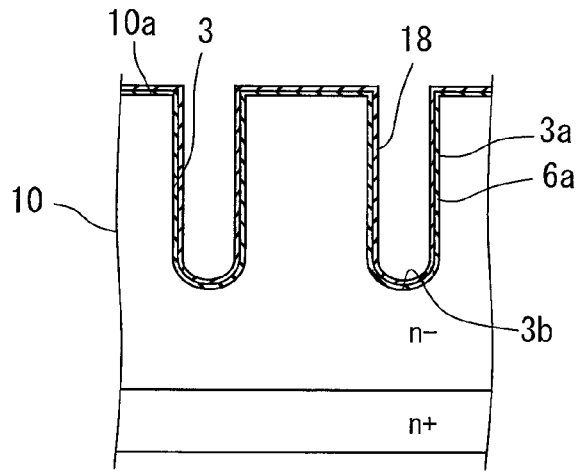
FIG. 15A to FIG. 15C are diagrams showing an example of a bottom wall insulating layer forming process shown in FIG. 14C.
Figure 15B:
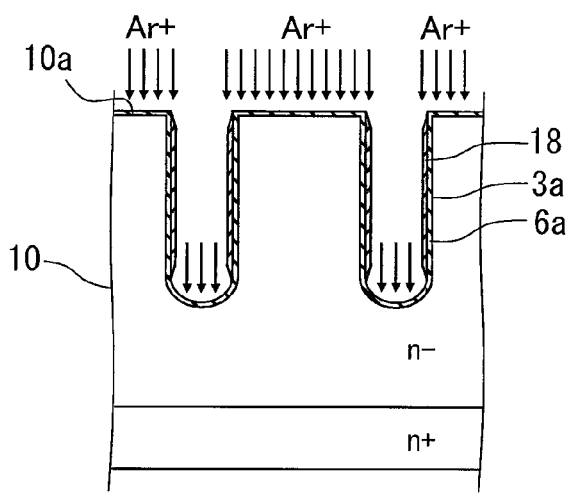

Next, as shown in FIG. 15B, the nitride layer 18 is anisotropically etched from the first main surface 10a in the depth direction of the trench 3 so that only the nitride layer 18 formed on the sidewall 3a of the trench 3 remain and the nitride layer 18 formed on the bottom wall 3b is selectively removed. In the present process, not only the nitride layer 18 formed on the bottom wall 3b of the trench 3 but also the nitride layer 18 formed on the first main surface 10a is removed at the same time.

Figure 15C:
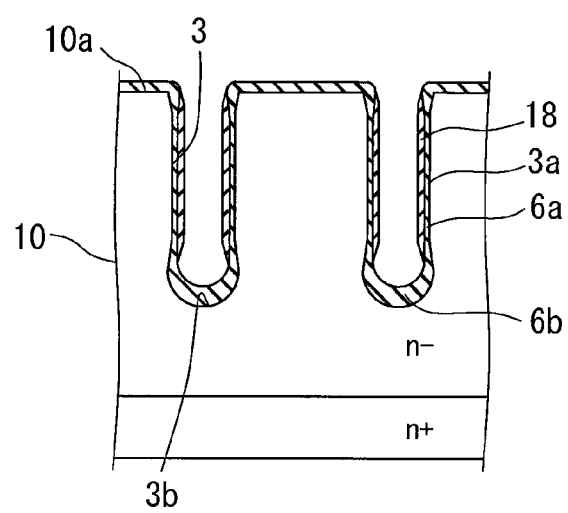

Next, as shown in FIG. 15C, the semiconductor substrate 10 is disposed in oxidation atmosphere in a state where the nitride layer 18 remains on the sidewall 3a of the trench 3. Accordingly, the bottom wall 3b of the trench 3, from which the nitride layer 18 is removed, is selectively thermally-oxidized, and the bottom wall insulating layer 6b thicker than the sidewall insulating layer 6a is formed on the bottom wall 3b. In the present process, not only the bottom wall 3b of the trench 3 but also the first main surface 10a of the semiconductor substrate, on which the nitride layer 18 is not formed, is thermally-oxidized, and the insulating layer thicker than the sidewall insulating layer 6a is formed.

The nitride layer 18 formed on the sidewall 3a of the trench 3 is removed by wet etching with phosphoric acid or isotropic dry etching. Accordingly, a state shown in FIG. 14C, in which the bottom wall insulating layer 6b is formed, can be obtained. The nitride layer 18 formed on the sidewall 3a of the trench 3 may be left without removing so that the sidewall insulating layer 6a and the nitride layer 18 form a sidewall insulating layer.

In a process of forming the bottom wall insulating layer 6b shown in FIG. 15A to FIG. 15C, the thickness of the bottom wall insulating layer 6b can be controlled with a thermal oxidation condition of the semiconductor substrate 10 shown in FIG. 15C, which is performed after selectively removing the nitride layer 18. Because the thickness of the bottom wall insulating layer 6b can be controlled in one process, variation in thickness of the bottom wall insulating layer 6b can be reduced compared with a conventional method in which the bottom wall insulating layer 6b is controlled by two processes including deposition of a CVD oxide layer and etch back.

Figure 16:
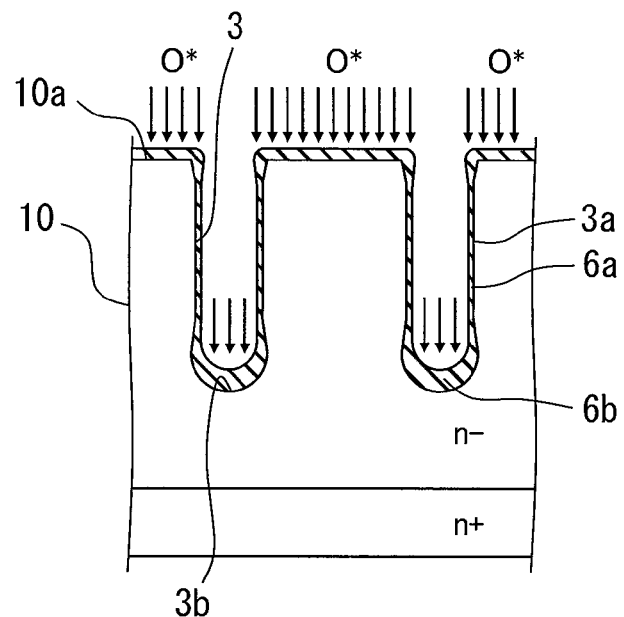
FIG. 16 is a diagram showing another example of the bottom wall insulating layer forming process shown in FIG. 14C.

In a process shown in FIG. 16, the bottom wall 3b of the trench 3 is selectively oxidized by an anisotropic plasma oxidation method. In the anisotropic plasma oxidation method, oxygen plasma is introduced in a direction. Oxidation rate is different between a surface to which the oxygen plasma collides perpendicularly and a surface parallel to the introduction direction of the oxygen plasma. The surface parallel to the introduction direction of the oxygen plasma is hardly oxidized, and a thick oxide layer is formed on the surface to which the oxygen plasma collides perpendicularly. The anisotropic plasma oxidation method is applied to the forming process of the bottom wall insulating layer 6b.

In the process shown in FIG. 16, after forming the sidewall insulating layer 6a as shown in FIG. 14B, oxygen plasma is introduced into the trench by applying a high bias, and the bottom wall 3b to which the oxygen plasma collides perpendicularly is selectively oxidized to form the bottom wall insulating layer 6b on the bottom wall 3b. Also in the present case, not only the bottom wall 3b of the trench 3 but also he first main surface 10a of the semiconductor substrate 10 to which the oxygen plasma collides perpendicularly is oxidized, and the insulating layer thicker than the sidewall insulating layer 6a is formed.

In the process shown in FIG. 16, the thickness of the bottom wall insulating layer 6b can be controlled with an introduction condition of the oxygen plasma which is introduced in the depth direction of the trench 3. Also in the present case, the thickness of the bottom wall insulating layer 6b can be controlled in one process. Thus, variation in thickness of the bottom wall insulating layer 6b can be reduced compared with the conventional method. The above-described forming method of the gate insulating layer 6 can be applied to the manufacturing methods of the semiconductor devices described in the first embodiment and the second embodiment.

Next, manufacturing processes of the semiconductor device 100 following the forming process of the bottom wall insulating layer 6b shown in FIG. 14C will be described.

Figure 17:
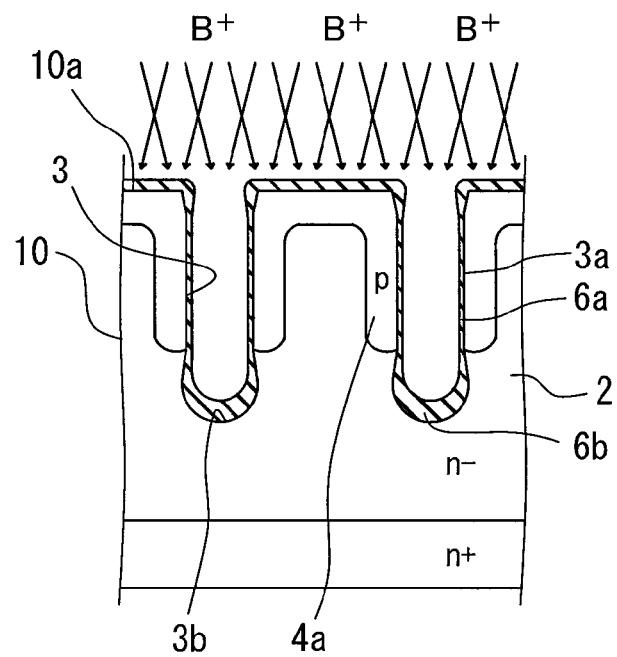
FIG. 17 is a diagram showing a manufacturing process of the semiconductor device according to the third embodiment.

After forming the bottom wall insulating layer 6b, as shown in FIG. 17, p-conductivity type impurities, such as boron (B), are introduced from the sidewall 3a of the trench 3 to the drift layer 2 of the semiconductor substrate 1 using the bottom wall insulating layer 6b as a mask. Due to the bottom wall insulating layer 6b having a large thickness, the p-conductivity type impurities are not introduced to the bottom wall 3b of the trench 3, and the channel layer 4a of the p-conductivity type (p) can be formed along the side wall 3a of the trench 3. In the present process, the p-conductivity type impurities are also introduced from the first main surface 10a, and the channel layer 4a is formed on the first main surface 10a. The channel layer 4a formed on the first main surface 10a couples the channel layers 4a formed along the sidewalls 3a of the adjacent trenches 3.

In the forming processes of the bottom wall insulating layer 6b shown in FIG. 15A to FIG. 15C and FIG. 16B, the insulating layer having a large thickness is formed not only on the bottom wall 3b of the trench 3 but also on the first main surface 10a of the semiconductor substrate 10. When the channel layer 4a is formed in a state where the insulating layer having a large thickness is disposed on the first main surface 10a, if a distance between the adjacent trenches 3 is long, the p-conductivity type impurities are not introduced to the first main surface 10a of the semiconductor substrate 10, and the channel layers 4a formed along the sidewalls 3a of the adjacent trenches 3 are not coupled. Thus, before forming the channel layer 4a as shown in FIG. 17, a thickness of the insulating layer formed on the first main surface 10a may be reduced.

In the forming process of the channel layer 4a shown in FIG. 17, the p-conductivity type impurities, such as boron (B), are implanted obliquely to the sidewall 3a of the trench 3. In cases where the p-conductivity type impurities are introduced obliquely, a thickness of the channel layer 4a from the sidewall 3a of the trench 3 and an impurity concentration can be easily controlled. However, the forming process of the channel layer 4a is not limited to the above-described example. For example, the p-conductivity type impurities may be introduced from the sidewall 3a of the trench 3 by vapor phase diffusion to form the channel layer 4a.

Figure 18A:
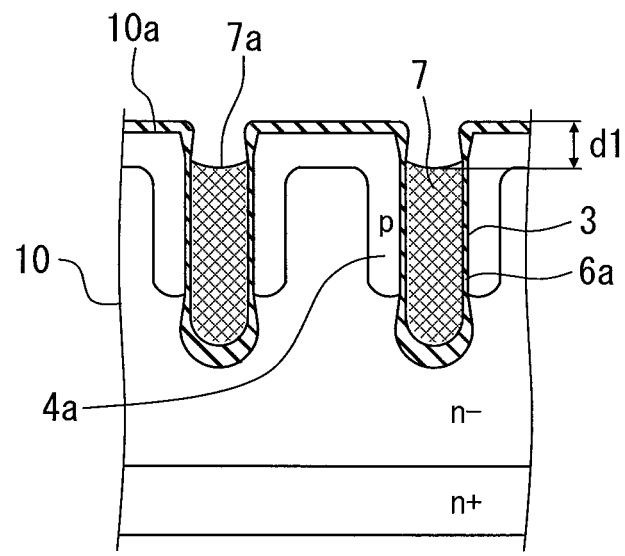
FIG. 18A and FIG. 18B are diagrams showing manufacturing processes of the semiconductor device according to the third embodiment.

Next, as shown in FIG. 18A, the gate electrode 7 is formed by filling the trench 3 with conductive material.

For example, conductive material, such as polysilicon, is deposited in the whole area of the first main surface 10a of the semiconductor substrate 10 to fill the trench 3, and the conductive material is etched back. In the present process, as shown in FIG. 18A, the gate electrode 7 may be formed so that a surface of the conductive material embedded in the trench 3 is located at a position deeper than the first main surface 10a of the semiconductor substrate 10. In other words, the conductive material is embedded in the trench 3 so that an upper end portion 7a of the gate electrode 7 is located at a position deeper than the first main surface 10a. Accordingly, impurities for forming the source layer 5 can be introduced using a depth d1 of the upper end portion 7a of the gate electrode 7, which is located at the deeper position than the first main surface 10a, as a reference. Accordingly, a depth d2 of the source layer 5 with respect to the depth d1 of the gate electrode 7 can be adjusted to the upper end portion 7a of the gate electrode 7 and can be self-aligned.

Figure 18B:
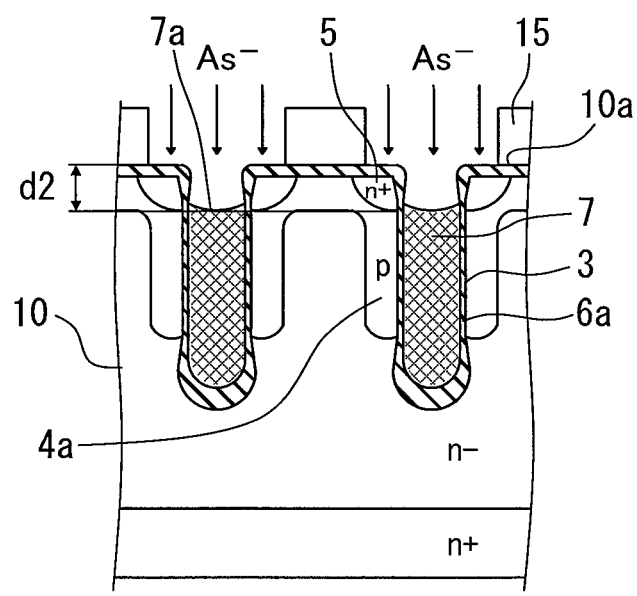

Next, as shown in FIG. 18B, a resist mask 15 having a predetermined opening portion is formed on the first main surface 10a of the semiconductor substrate 10, and n-conductivity type impurities, such as arsenic (As), are introduced to the semiconductor substrate by ion implantation. Accordingly, the source layer 5 of the n-conductivity type ($n^+$) is formed above the channel layer 4a, which is formed along the sidewall 3a of the trench 3. In the present process, as described above, the depth d2 of the source layer 5 can be self-aligned using the depth d1 of the gate electrode 7 shown in FIG. 18A as the reference. When the distance between the adjacent trenches 3 is short, the n-conductivity impurities may be introduced to the whole area of the first main surface 10a of the semiconductor substrate 10 by ion implantation without forming the resist mask 15.

Figure 19A:
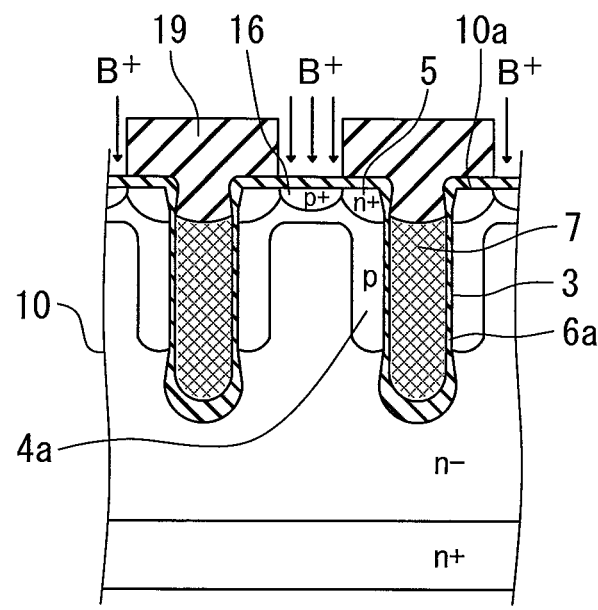
FIG. 19A and FIG. 19B are diagrams showing manufacturing processes of the semiconductor device according to the third embodiment.

Next, as shown in FIG. 19A, a resist mask 19 having a predetermined opening portion is formed on the first main surface 10a of the semiconductor substrate, and p-conductivity type impurities, such as boron (B), are introduced into the semiconductor substrate 10. Accordingly, the body contact region 16 of the p-conductivity type ($p^+$) is formed midway between the adjacent trenches 3.

Figure 19B:
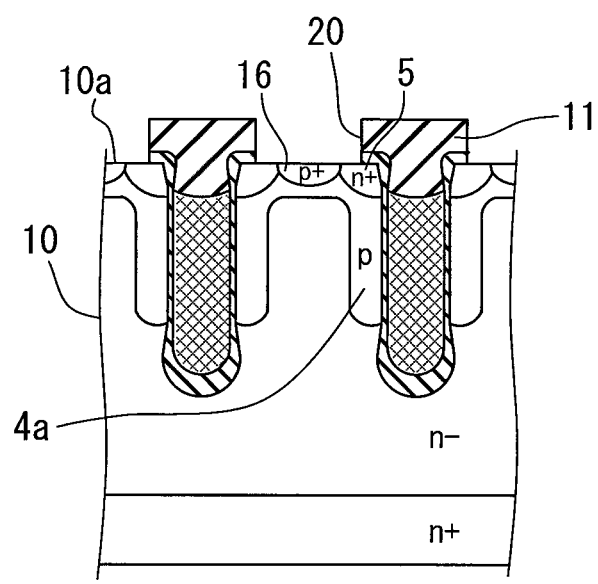

Next, as shown in FIG. 19B, the interlayer insulating layer 11 is deposited in the whole area of the first main surface 10a of the semiconductor substrate 10, and an opening portion 20 for coupling the source layer 5 of the n-conductivity type ($n^+$) and the body contact region 16 of the p-conductivity type ($p^+$) with the source electrode 17 are formed.

Finally, wiring material, such as aluminum (Al), is deposited to the whole area of the first main surface 10a of the semiconductor substrate 10 to form the source electrode 17 coupled with the source layer 5 and the body contact region 16. Accordingly, the semiconductor device 100 shown in FIG. 13 can be manufactured.

Next, effects of the manufacturing method of the semiconductor device 100 according to the present embodiment will be described.

In the present embodiment, the channel layer 4a is formed by introducing impurities into the sidewall 3a of the trench 3 using the bottom wall insulating layer 6b formed on the bottom wall 3b of the trench 3 as the mask. Thus, a resist process for forming the channel layer 4a is not required, and the gate projection length, which is the distance between the lower end portion of the trench 3 and the lower end portion 9 of the channel layer 4a, is determined by the channel layer 4a, which is self-aligned by the bottom wall insulating layer 6b as the mask. Because the manufacturing process can be simplified by omitting the resist process, a manufacturing process can be reduced. Furthermore, variation in gate projection length due to the resist process can be removed.

The bottom wall insulating layer 6b having a larger thickness than the sidewall insulating layer 6a is formed by selectively oxidizing the bottom wall 3b of the trench 3. In this way, the thickness of the bottom wall insulating layer 6b can be simplified in one process. Thus, variation in thickness of the bottom wall insulating layer 6b can be reduced compared with the conventional forming method of the bottom wall insulating layer including two processes. Because the gate projection length depends on the thickness of the bottom wall insulating layer 6b, variation in gate projection length can be reduced.

In the present embodiment, the channel layer 4a along the sidewall 3a is formed by introducing the p-conductivity type impurities from the sidewall 3a of the trench 3. Thus, in the depth direction of the trench 3, inclination and variation in impurity concentration of the channel layer 4a can be reduced, and variation in gate threshold voltage can be reduced.

As described above, by the manufacturing method according to the present embodiment, variation in gate projection length from the lower end portion 9 of the channel layer 4a can be reduced, and the performance and the cost of the semiconductor device 100 are compatible.

Fourth Embodiment

Figure 20:
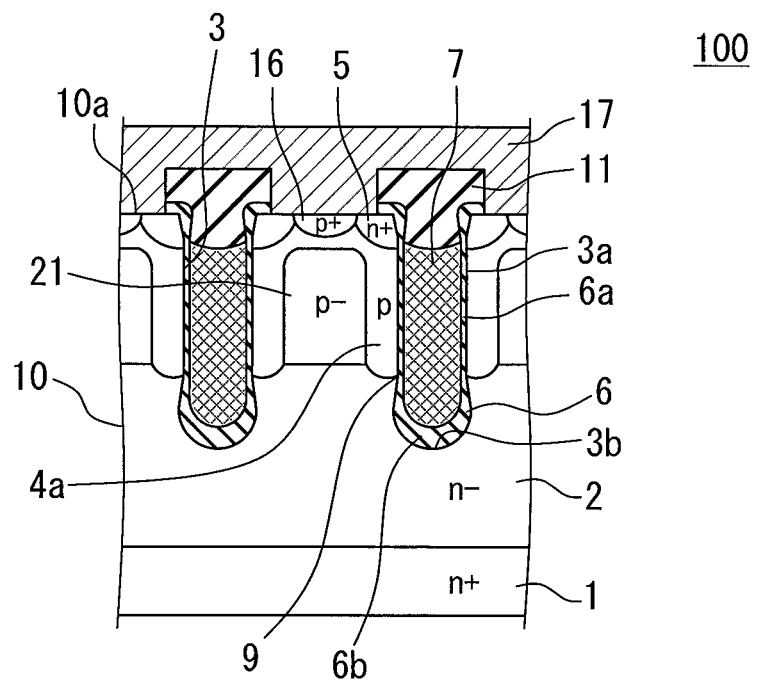
FIG. 20 is a cross-sectional view of a semiconductor device according to a fourth embodiment of the present disclosure.

A manufacturing method of a semiconductor device 100 according to a fourth embodiment of the present disclosure will be described. As shown in FIG. 20, the semiconductor device 100 according to the present embodiment has a structure basically similar to the semiconductor device 100 shown in FIG. 13 according to the third embodiment. Deference from the semiconductor device 100 according to the third embodiment is that a low concentration body layer 21 of the p-conductivity type (p⁻) is disposed on the drift layer 2.

The low concentration body layer 21 has a lower impurity concentration than the channel layer 4a of the p-conductivity type (p). The low concentration body layer 21 is formed to a depth similar to the lower end portion 9 of the channel layer 4a. Thus, different from the semiconductor device 100 shown in FIG. 13, a region between the adjacent trenches 3 is p-conductivity type to a depth near the lower end portion 9 of the channel layer 4a except for the source layer 5. Thus, the potential of the channel layer 4a formed along the sidewall 3a of the trench 3 can be stabilized. Furthermore, because the low concentration body layer 21 of the p-conductivity type is located between the channel layers 4a formed along the sidewalls 3a of the adjacent trenches 3, effects as a JFET can be restricted.

Furthermore, in the example shown in FIG. 20, the low concentration body layer 21 is formed to the depth similar to the lower end portion 9 of the channel layer 4a. Between the adjacent trenches 3, a boundary surface between the n-conductivity type region and the p-conductivity type region is substantially flat and there is no large change in curvature. Thus, electric field concentration is less likely to occur.

Furthermore, because the channel layer 4a and the low concentration body layer 21 are shallower than the trench 3, a breakdown point can be at the lower end portion of the trench 3. Accordingly, the drain breakdown voltage can be improved.

A manufacturing method of the semiconductor device 100 shown in FIG. 20 will be described with reference to FIG. 21 to FIG. 24B.

Figure 21:
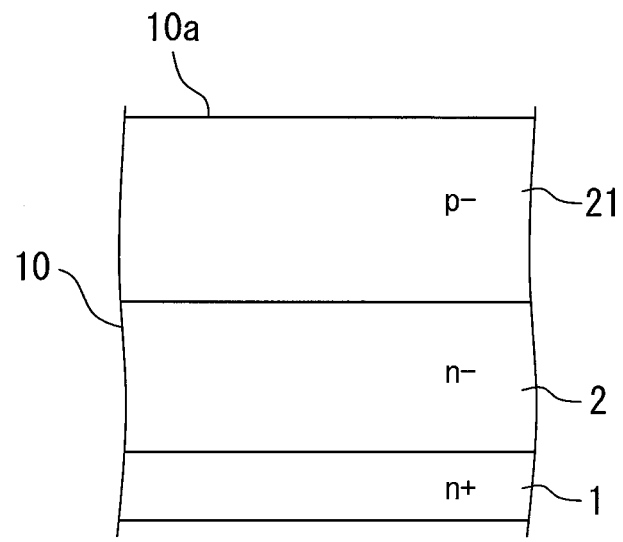
FIG. 21 is a diagram showing a manufacturing process of the semiconductor device according to the fourth embodiment.

Firstly, as shown in FIG. 21, the semiconductor substrate 10 is prepared. In the semiconductor substrate 10, the drift layer 2 of the n-conductivity type (n⁻) is formed on the silicon substrate 1 of the n-conductivity type (n⁺), and the low concentration body layer 21 of the p-conductivity type (p⁻) is formed on the drift layer 2. In this way, before forming the trench 3, the low concentration body layer 21 having a lower impurity concentration than the channel layer 4a, which is formed in a later process, is formed at a portion of the semiconductor substrate 10 adjacent to the first main surface 10a.

Figure 22A:
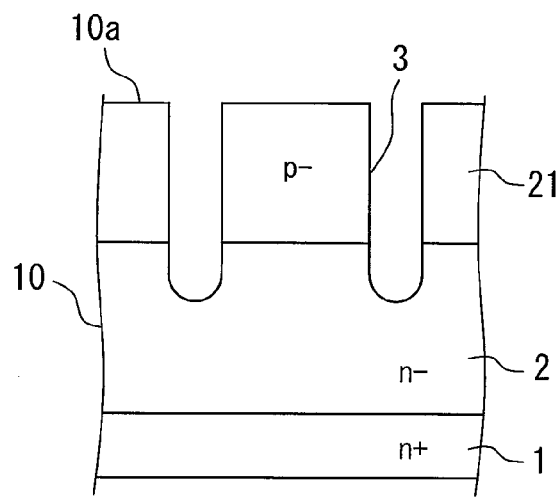
FIG. 22A to FIG. 22C are diagrams showing manufacturing processes of the semiconductor device according to the fourth embodiment.

Next, as shown in FIG. 22A, the trench 3 is defined from the first main surface 10a of the semiconductor substrate 10 into the drift layer 2 through the low concentration body layer 21. In the process of defined the trench 3, an etchant may be selected so that an etching rate of the drift layer 2 of the n-conductivity type is lower than an etching rate of the low concentration body layer 21 of the p-conductivity type.

Accordingly, the low concentration body layer 21 of the p-conductivity type is etched at a high rate, and the etching rate rapidly decreases when the lower portion of the trench 3 reaches a boundary surface between the low concentration body layer 21 and the drift layer 2 of the n-conductivity type. The boundary surface functions as a stopper of the etching, and the etching rate of the drift layer 2 is low. Thus, the depth of the trench 3 can be controlled with accuracy. The etching can be performed, for example, by reactive ion etching using chlorine (Cl)-based gas or bromine (Br)-based gas.

Processes shown in FIG. 22B or later are similar to the manufacturing processes of the semiconductor device 100 according to the third embodiment shown in FIG. 14B or later. Thus, only correspondence relationship of each figure will be described, and a description about contents of the processes will be not described.

Figure 22B:
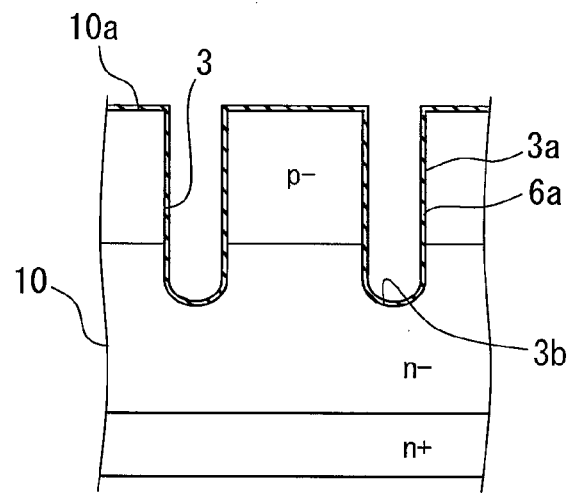
Figure 22C:
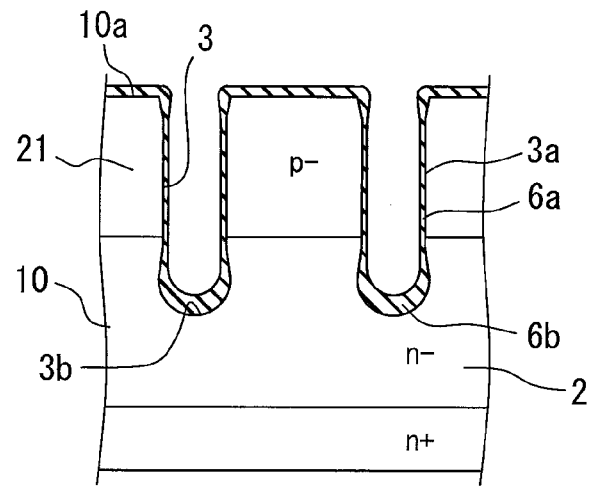

In a process shown in FIG. 22B, the sidewall insulating layer 6a is formed in a manner similar to the process shown in FIG. 14B. In a process shown in FIG. 22C, the bottom wall insulating layer 6b is formed in a manner similar to the process shown in FIG. 14B. The bottom wall insulating layer 6b in the present embodiment may also be formed in a manner similar to the process shown in FIG. 15 or FIG. 16.

Figure 23A:
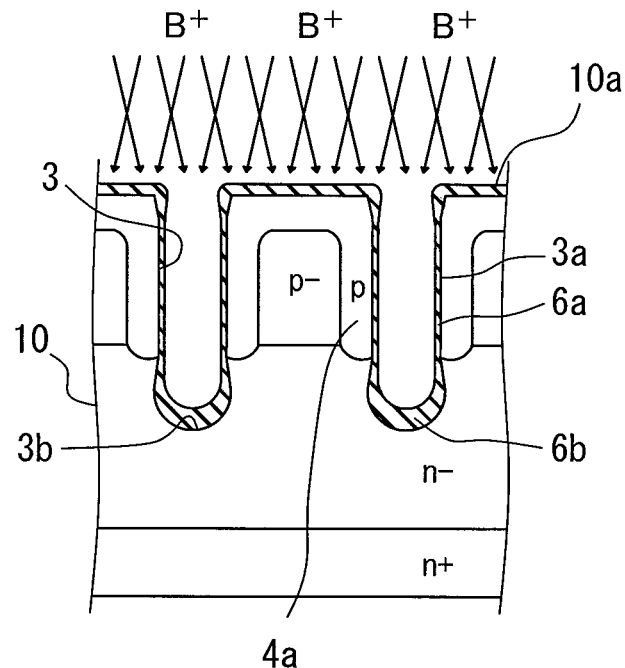
FIG. 23A and FIG. 23B are diagrams showing manufacturing processes of the semiconductor device according to the fourth embodiment.
Figure 23B:
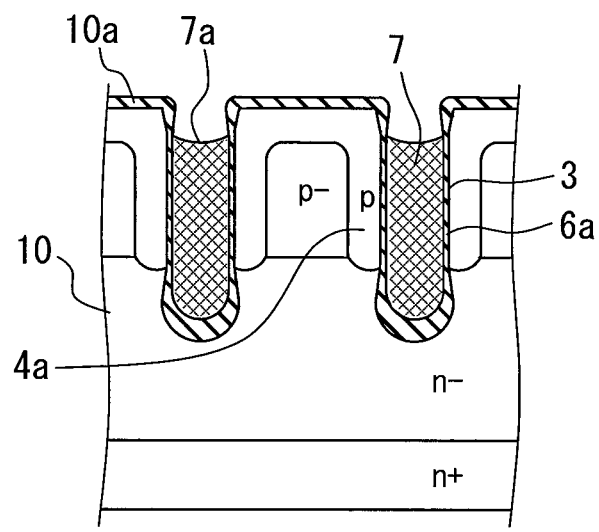

In a process shown in FIG. 23A, the channel layer 4a is formed in a manner similar to the process shown in FIG. 17. In a process shown in FIG. 23B, the gate electrode 7 is formed in a manner similar to the process shown in FIG. 18A.

Figure 24A:
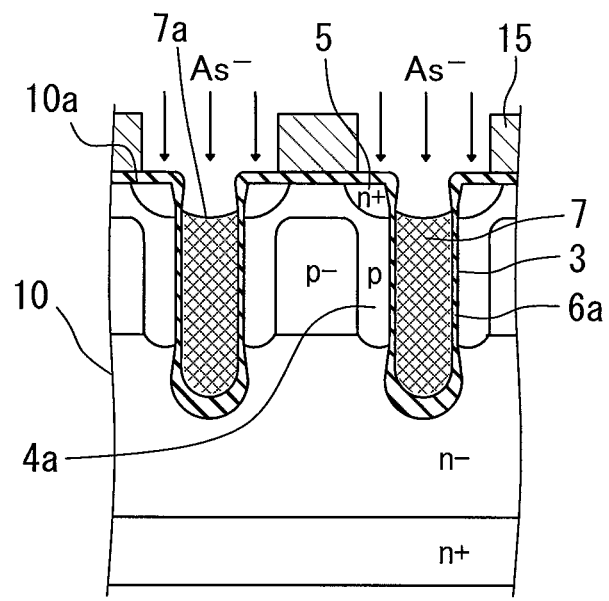
FIG. 24A and FIG. 24B are diagrams showing manufacturing processes of the semiconductor device according to the fourth embodiment.
Figure 24B:
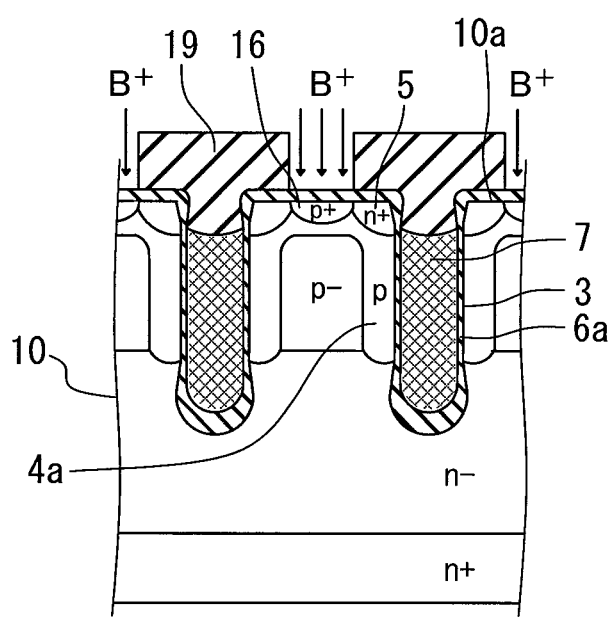

In a process shown in FIG. 24A, the source layer 5 is formed in a manner similar to the process shown in FIG. 18B. In a process shown in FIG. 24B, the body contact region 16 is formed in a manner similar to the process shown in FIG. 19A.

After forming the body contact region 16, the interlayer insulating layer 11 is formed in the whole area of the first main surface 10a of the semiconductor substrate 10 and the opening portion 20, through which the source electrode 17 is coupled with the source layer 5 and the body contact region 16, is defined, as described with reference to FIG. 19B.

Finally, wiring material, such as aluminum (Al) is deposited to the whole area of the first main surface 10a of the semiconductor substrate 10 to form the source electrode 17 coupled with the source layer 5 and the body contact region 16. Accordingly, the semiconductor device 100 shown in FIG. 20 can be manufactured.

Fifth Embodiment

Figure 25:
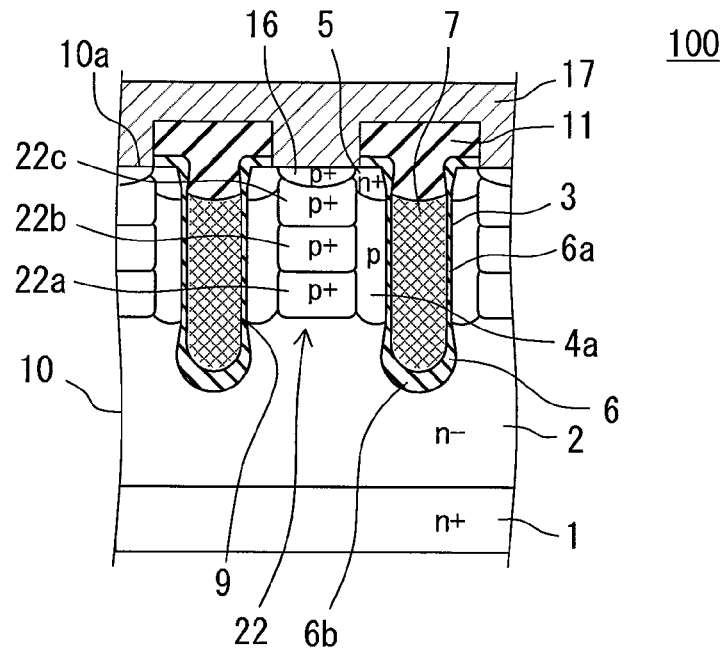
FIG. 25 is a cross-sectional view of a semiconductor device according to a fifth embodiment of the present disclosure.

A manufacturing method of a semiconductor device 100 according to a fifth embodiment of the present disclosure will be described. As shown in FIG. 25, the semiconductor device 100 according to the present embodiment has a structure basically similar to the semiconductor device 100 according to the fourth embodiment shown in FIG. 20. Difference from the semiconductor device 100 according to the fourth embodiment is that a high concentration body region 22 of the p-conductivity type (p⁺) is provided instead of the low concentration body layer 21 of the p-conductivity type (p⁻).

The high concentration body region 22 has a higher impurity concentration than the channel layer 4a of the p-conductivity type and includes a plurality of layers. In the same plane position of the semiconductor substrate 10 as the body contact region 16 of the p-conductivity type (p⁺), three layers of the high concentration body region 22 are coupled with the body contact region 16. A lower end portion of a lowest layer 22a of the high concentration body region 22 is located at a depth similar to the lower end portion 9 of the channel layer 4a. A highest layer 22c of the high concentration body region 22 is adjacent to the body contact region 16 at a surface portion of the semiconductor substrate 10 adjacent to the first main surface 10a. A middle layer 22b of the high concentration body region 22 is disposed between the lowest layer 22a and the highest layer 22c.

Also in the semiconductor device 100 shown in FIG. 24, a portion between the adjacent trenches 3 is p-conductivity type to a depth similar to the lower end portion 9 of the channel layer 4a except for the source layer 5. Thus, the potential of the channel layers 4a formed along the sidewalls 3a of the trenches 3 can be stabilized. Furthermore, effects as a JFET can be restricted.

Furthermore, also in the semiconductor device 100 shown in FIG. 25, the lower end portion of the high concentration body region 22 is formed to the depth similar to the lower end portion 9 of the channel layer 4a. Between the adjacent trenches 3, a boundary surface between the n-conductivity type region and the p-conductivity type region is substantially flat and there is no large change in curvature. Thus, electric field concentration is less likely to occur.

Furthermore, because the channel layer 4a and the high concentration body region 22 are shallower than the trench 3, a breakdown point can be at the lower end portion of the trench 3. Accordingly, the drain breakdown voltage can be improved.

Figure 26:
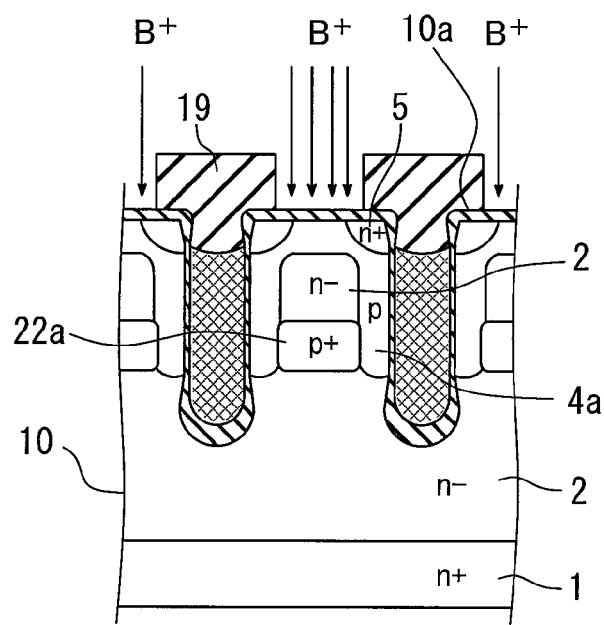
FIG. 26 is a diagram showing a manufacturing process of the semiconductor device according to the fifth embodiment.

When the semiconductor device 100 is manufactured, after the process described with reference to FIG. 18B is performed, ion implantation is performed in multiple steps with different implantation depths. FIG. 26 shows a state where the lowest layer 22a of the high concentration body region 22 is formed.

In the process shown in FIG. 26, the ion implantation in multiple steps is performed with the resist mask 19. The ion implantation in multiple steps may also be performed using the opening portion 20 provided in the interlayer insulating layer 11 as a mask. After the ion implantation in multiple steps is performed, the implanted ions are activated and diffused at a predetermined temperature for a predetermined time that are determined so as not to affect the channel layer 4a, which is formed before. In cases where a clearance with the channel layer 4a is about 0.5 μm, even when impurities are implanted at high concentration to $10^{15}$ cm$^{-2}$, the implanted ions can be activated and diffused by annealing at 900° C. without affecting the channel layer 4a.

Figure 27:
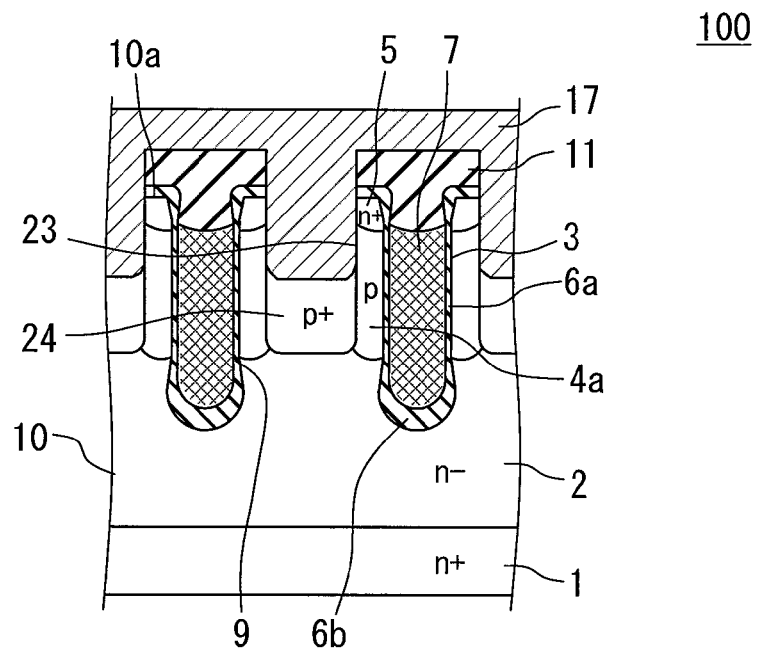
FIG. 27 is a cross-sectional view of a semiconductor device according to a modification.

In the above-described embodiment, the high concentration body region 22 is formed by the ion implantation in multiple steps. As shown in FIG. 27, another trench 23 may be formed at a portion between the adjacent trenches 3, and a high concentration body region 24 of the p-conductivity type (p$^+$) may be formed so as to adjacent to a lower end portion of the trench 23. A lower end portion of the high concentration body region 24 is located at a depth similar to the lower end portion 9 of the channel layer 4a. The high concentration body region 24 also operates as the body contact region 16 of the semiconductor device 100 shown in FIG. 13. The source electrode 17 is coupled with the high concentration body region 24 and the source layer 5 through the interlayer insulating layer 11.

Figure 28:
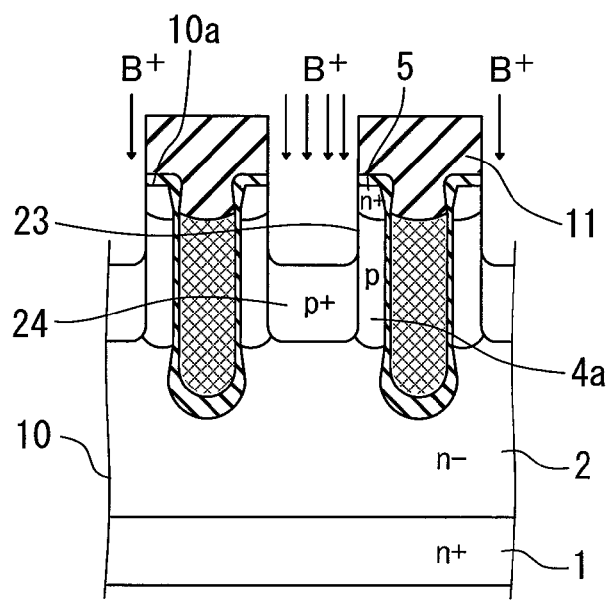
FIG. 28 is a diagram showing a manufacturing process of the semiconductor device shown in FIG. 27.

When the semiconductor device 100 shown in FIG. 27 is manufactured, the manufacturing process of the interlayer insulating layer 11 shown in FIG. 19B is performed without performing the manufacturing process of the body contact region 16 shown in FIG. 19A. Then, as shown in FIG. 28, an etching is continued even after defining the opening portion 20 in the interlayer insulating layer 11 to define the trench 23. Next, an ion implantation is performed through the trench 23 to form the high concentration body region 24. The implanted ions are activated and diffused at a predetermined temperature for a predetermined time that are determined so as not to affect the channel layer 4a, which is formed before.

By the manufacturing methods shown in FIG. 26 and FIG. 28 a p-conductivity type impurity region between the adjacent trenches 3 can have a higher concentration compared with a case where the low concentration body layer 21 is previously formed before defining the trench 3. Thus, in the semiconductor devices 100 shown in FIG. 25 and FIG. 27, the potential of the channel layer 4a formed along the sidewall 3a of the trench 3 can be stabilized more effectively compared with the semiconductor device shown in FIG. 20. Furthermore, it is needless to say that electric field concentration is less likely to occur by forming the boundary surface between the p-conductivity type region and the n-conductivity type region to be substantially flat.

While the present disclosure has been described with reference to embodiments thereof, it is to be understood that the disclosure is not limited to the embodiments and constructions. The present disclosure is intended to cover various modification and equivalent arrangements.

The conductivity type of each layer in the semiconductor devices according to the above-described embodiments is not limited to the conductivity type, for example, shown in FIG. 1. In other words, the semiconductor devices may include p-channel type element.

In each of the above-described embodiments, the semiconductor device 100 includes the MOSFET. The semiconductor device may also include an IGBT. In this case, the semiconductor device 100 includes a silicon substrate 1 of the p-conductivity type (p$^+$), which operates as a collector, and the semiconductor device 100 can be manufactured similarly to the manufacturing method described in each of the above-described embodiments.

The semiconductor device 100 without the adjustment layer 8 may include the high concentration body region 4b shown in FIG. 1. On the other hand, the semiconductor device 100 with the adjustment layer 8 may include the high concentration body region 22 in FIG. 25 or the high concentration body region 24 in FIG. 27.

The semiconductor device 100 without the adjustment layer 8 may include the low concentration body layer 21 shown in FIG. 20 instead of the high concentration body region 4b.

In each of the first embodiment, the second embodiment, and the fifth embodiment, the lower end portion of the high concentration body regions 4b, 22, 24 is located at the depth similar to the lower end portion 9 of the channel layer 4a and is shallower than the lower end portion of the trench 3. However, the depth of the high concentration body region 4b, 22, 24 is not limited to the above-described example.

Figure 29:
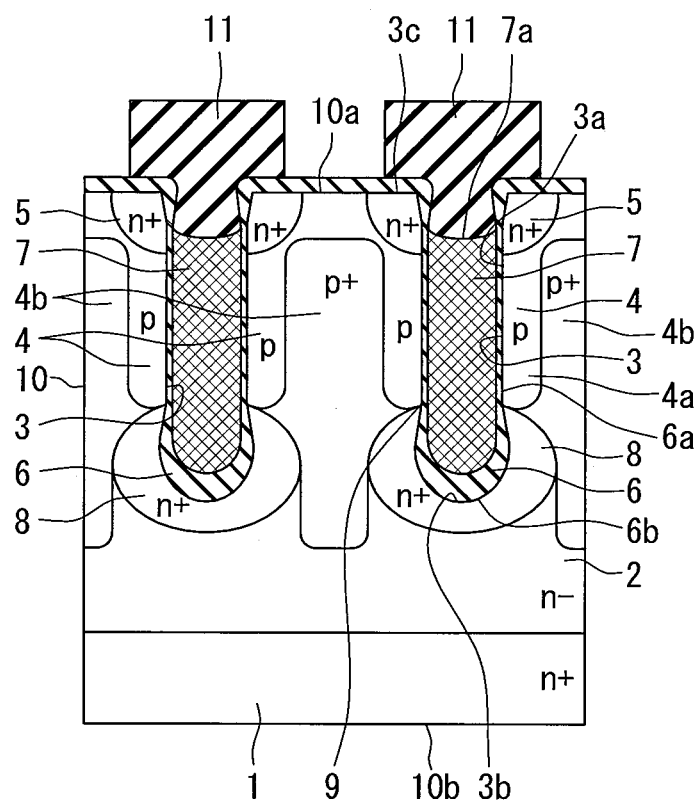
FIG. 29 is a cross-sectional view of a semiconductor device according to another modification.

For example, in a semiconductor device 100 shown in FIG. 29, the high concentration body region 4b extends to a position deeper than the lower end portion 9 of the channel layer 4a and the lower end portion of the trench 3 with respect to the semiconductor device 100 shown in FIG. 1.

Figure 30:
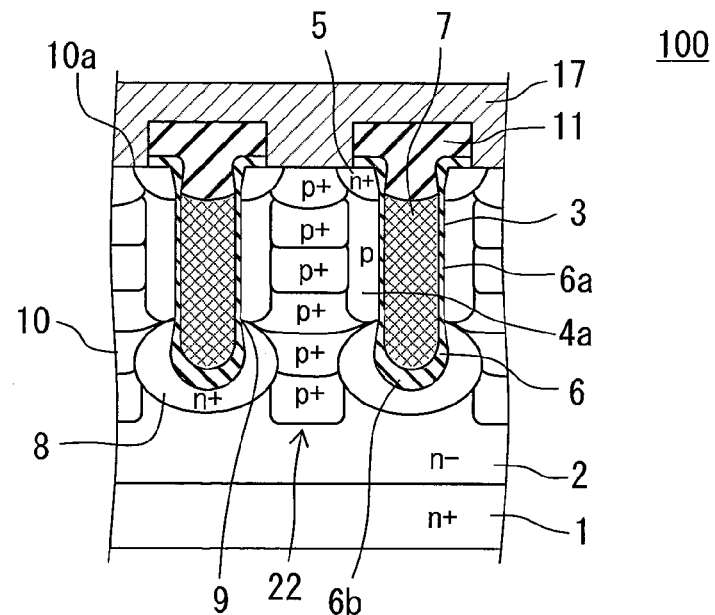
FIG. 30 is a cross-sectional view of a semiconductor device according to another modification.

In a semiconductor device 100 shown in FIG. 30, the high concentration body region 22 shown in FIG. 25 and formed by the ion implantation in multiple steps is combined with the semiconductor device 100 shown in FIG. 1. The high concentration body region 22 extends to a position deeper than the lower end portion 9 of the channel layer 4a and the lower end portion of the trench 3.

Figure 31:
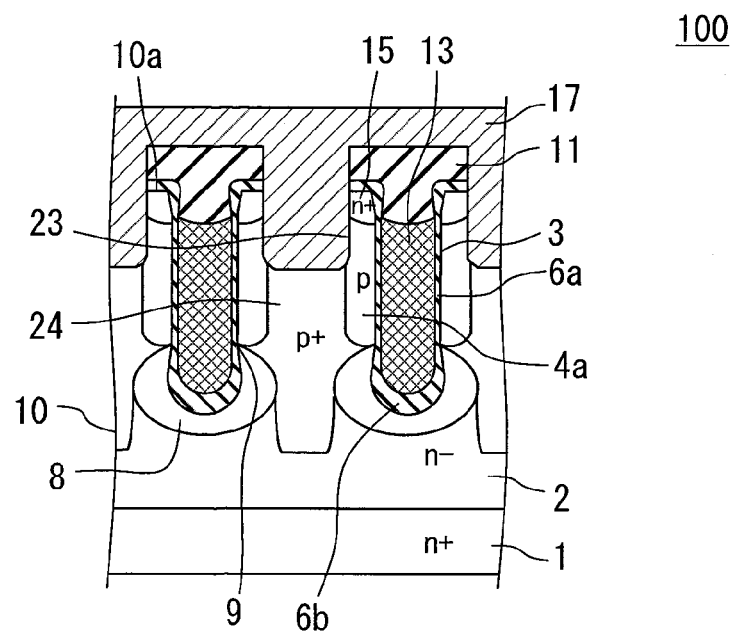
FIG. 31 is a cross-sectional view of a semiconductor device according to another modification.

In a semiconductor device 100 shown in FIG. 31, the high concentration body region 24 shown in FIG. 27 and formed with the trench 23 is combined with the semiconductor device 100 shown in FIG. 1. The high concentration body region 24 extends to a position deeper than the lower end portion 9 of the channel layer 4a and the lower end portion of the trench 3.

Figure 32:
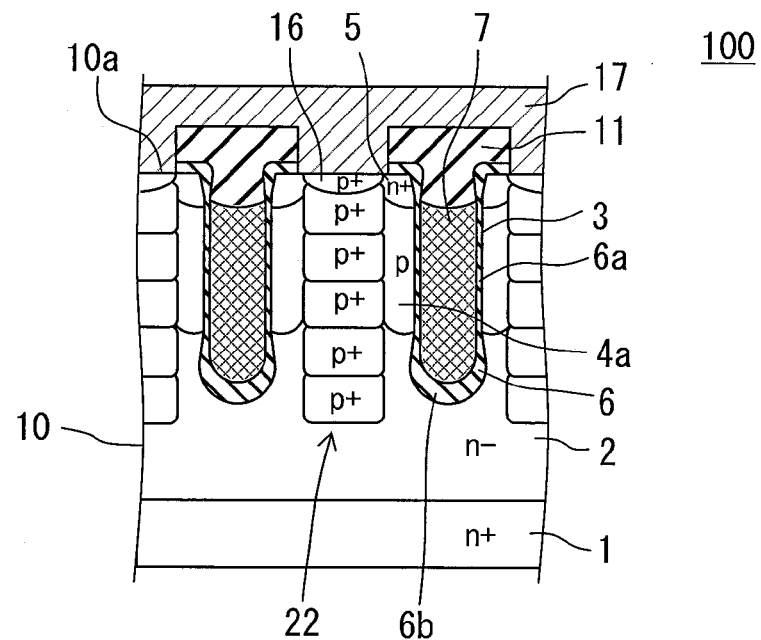
FIG. 32 is a cross-sectional view of a semiconductor device according to another modification.

In a semiconductor device 100 shown in FIG. 32, the high concentration body region 22 extends to a position deeper than the lower end portion 9 of the channel layer 4a and the lower end portion of the trench 3 with respect to the semiconductor device 100 shown in FIG. 25.

Figure 33:
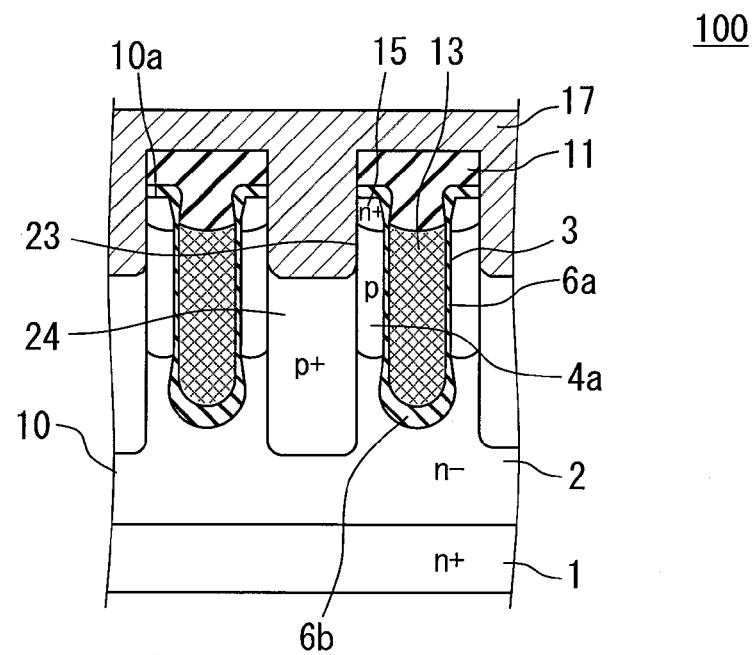
FIG. 33 is a cross-sectional view of a semiconductor device according to another modification.

In a semiconductor device 100 shown in FIG. 33, the high concentration body region 24 extends to a position deeper than the lower end portion 9 of the channel layer 4a and the bottom portion of the trench 3.

As described in FIG. 29 to FIG. 33, in cases where the high concentration body region 4b, 22, 24 extends to the position deeper than the lower end portion of the trench 3, a breakdown point at avalanche breakdown is located at the lower end portion of the high concentration body region 4b, 22, 24 not the lower end portion of the trench 3. Accordingly, carriers generated at the avalanche breakdown are extracted through the high concentration body region 4*b*, 22, 24. Thus, the recovery breakdown can be improved.

As described in FIG. 29 to FIG. 33, in cases where the high concentration body region 4*b*, 22, 24 extends to the position deeper than the lower end portion of the trench 3, a breakdown point at avalanche breakdown is located at the lower end portion of the high concentration body region 4*b*, 22, 24 not the lower end portion of the trench 3. Accordingly, carriers generated at the avalanche breakdown are extracted through the high concentration body region 4*b*, 22, 24. Thus, the recovery breakdown can be improved.

In a configuration including the adjustment layer 8, even in cases where the high concentration body region 4*b*, 22, 24 extends to the position deeper than the lower end portion 9 of the channel layer 4*a*, the adjustment layer 8 can restrict the lower end portion 9 of the channel layer 4*a* from sinking when the high concentration body region 4*b*, 22, 24 is formed. Thus, in a configuration in which the high concentration body region 4*b*, 22, 24 extends to the position deeper than the lower end portion of the trench 3, the channel layer 4*a* can be restricted from sinking and the recovery breakdown voltage can be improved.

What is claimed is:

1. A manufacturing method of a semiconductor device, comprising:
    preparing a semiconductor substrate having a main surface and including a drift layer of a first conductivity type;
    defining a trench in the semiconductor substrate from the main surface into the drift layer;
    forming a gate insulating layer covering a sidewall and a bottom wall of the trench, the forming the gate insulating layer including forming a sidewall insulating layer on a sidewall of the trench and forming a bottom wall insulating layer thicker than the sidewall insulating layer on a bottom wall of the trench by selectively oxidizing the bottom wall of the trench after the forming the sidewall insulating layer;
    forming a channel layer along the sidewall of the trench by introducing second conductivity type impurities from the sidewall of the trench using the bottom wall insulating layer as a mask;
    embedding a gate electrode in the trench after the forming the gate insulating layer,
    forming a low concentration body layer by introducing second conductivity type impurities from the main surface of the semiconductor substrate before the defining the trench,
    wherein the low concentration body layer has an impurity concentration lower than the channel layer, and
    wherein the low concentration body layer is shallower than the trench.

2. The manufacturing method according to claim 1, wherein the forming the bottom wall insulating layer includes:
    depositing a nitride layer to a whole area of the main surface of the semiconductor substrate after the forming the sidewall insulating layer;
    selectively removing the nitride layer formed on the bottom wall of the trench while leaving the nitride layer formed on the sidewall of the trench by anisotropic etching in a depth direction of the trench; and
    selectively oxidizing the bottom wall of the trench, from which the nitride layer is removed, by thermally oxidizing the semiconductor substrate.

3. The manufacturing method according to claim 1, wherein the forming the bottom wall insulating layer includes selectively oxidizing the bottom wall of the trench by introducing oxygen plasma in a depth direction of the trench.

4. The manufacturing method according to claim 1, wherein the forming the channel layer includes implanting the second conductivity type impurities obliquely to the sidewall of the trench.

5. The manufacturing method according to claim 1, wherein
    the defining the trench includes using an etchant with which an etching rate of the drift layer is lower than an etching rate of the low concentration body layer.

6. The manufacturing method according to claim 1, wherein the forming the gate electrode includes forming the gate electrode in such a manner that an end portion of the gate electrode adjacent to the main surface is located at a portion in the trench deeper than an open end of the trench, and
    the manufacturing method further comprising forming a source layer or an emitter layer by implanting first conductivity type impurities at least from the sidewall of the trench after the forming the gate electrode.

* * * * *